(12) United States Patent
Hilliard

(10) Patent No.: US 9,097,437 B2
(45) Date of Patent: Aug. 4, 2015

(54) SOLAR RECEIVER AND ASSOCIATED ENERGY CONVERSION APPARATUS

(76) Inventor: Donald Bennett Hilliard, El Granada, CA (US)

(*) Notice: Subject to any disclaimer, the term of this patent is extended or adjusted under 35 U.S.C. 154(b) by 208 days.

(21) Appl. No.: 13/261,486

(22) PCT Filed: Jan. 11, 2011

(86) PCT No.: PCT/US2011/000050
§ 371 (c)(1),
(2), (4) Date: Mar. 4, 2013

(87) PCT Pub. No.: WO2011/084902
PCT Pub. Date: Jul. 14, 2011

(65) Prior Publication Data
US 2013/0319501 A1 Dec. 5, 2013

Related U.S. Application Data

(60) Provisional application No. 61/335,755, filed on Jan. 11, 2010, provisional application No. 61/337,338, filed on Feb. 1, 2010, provisional application No. 61/396,387, filed on May 26, 2010.

(51) Int. Cl.
| | |
|---|---|
| H02N 6/00 | (2006.01) |
| H01L 31/042 | (2014.01) |
| F24J 2/04 | (2006.01) |
| F24J 2/05 | (2006.01) |
| F24J 2/07 | (2006.01) |
| F24J 2/14 | (2006.01) |
| H01L 31/052 | (2014.01) |
| H01L 31/054 | (2014.01) |

(52) U.S. Cl.
CPC .. *F24J 2/055* (2013.01); *F24J 2/07* (2013.01); *F24J 2/14* (2013.01); *H01L 31/0525* (2013.01); *H01L 31/0547* (2014.12); *Y02E 10/41* (2013.01); *Y02E 10/44* (2013.01); *Y02E 10/45* (2013.01); *Y02E 10/52* (2013.01)

(58) Field of Classification Search
USPC .......... 136/246, 248, 255; 126/652, 653, 678, 126/684, 714
See application file for complete search history.

(56) References Cited

U.S. PATENT DOCUMENTS

| | | | | |
|---|---|---|---|---|
| 4,067,315 | A * | 1/1978 | Fehlner et al. | 126/636 |
| 4,184,895 | A * | 1/1980 | Oster, Jr. | 136/247 |
| 4,471,155 | A * | 9/1984 | Mohr et al. | 136/258 |
| 4,743,095 | A * | 5/1988 | Dane | 359/853 |
| 2005/0244644 | A1 * | 11/2005 | Hampden-Smith et al. | 428/408 |
| 2008/0127967 | A1 * | 6/2008 | Kimura et al. | 126/694 |

* cited by examiner

*Primary Examiner* — Eli Mekhlin

(57) ABSTRACT

The disclosed invention relates to solar-thermal receiver tubes for heating high-temperature fluids such as molten salts and oils, such as those used in conjunction with trough reflectors or concentric concentrators. The disclosed invention utilizes fused silica receiver tube assemblies that provide optical absorption by way of optically-absorbing media that is imbedded within the thermal transfer fluid, preferably comprising inorganic "dyes" that comprise pulverized thin film coatings or dissolved materials that are specifically designed for maximizing optical absorption. Alternatively, the chemistry of the transfer fluid can be modified to increase optical absorption, or the optically absorbing media may comprise fine powders with density preferably similar to the thermal transfer fluid, such as fine graphite powder; or, in another preferred embodiment, absorbing means within the heat transfer fluid comprise a solid absorbing element disposed along the central axis of the receiver tube's interior.

20 Claims, 21 Drawing Sheets

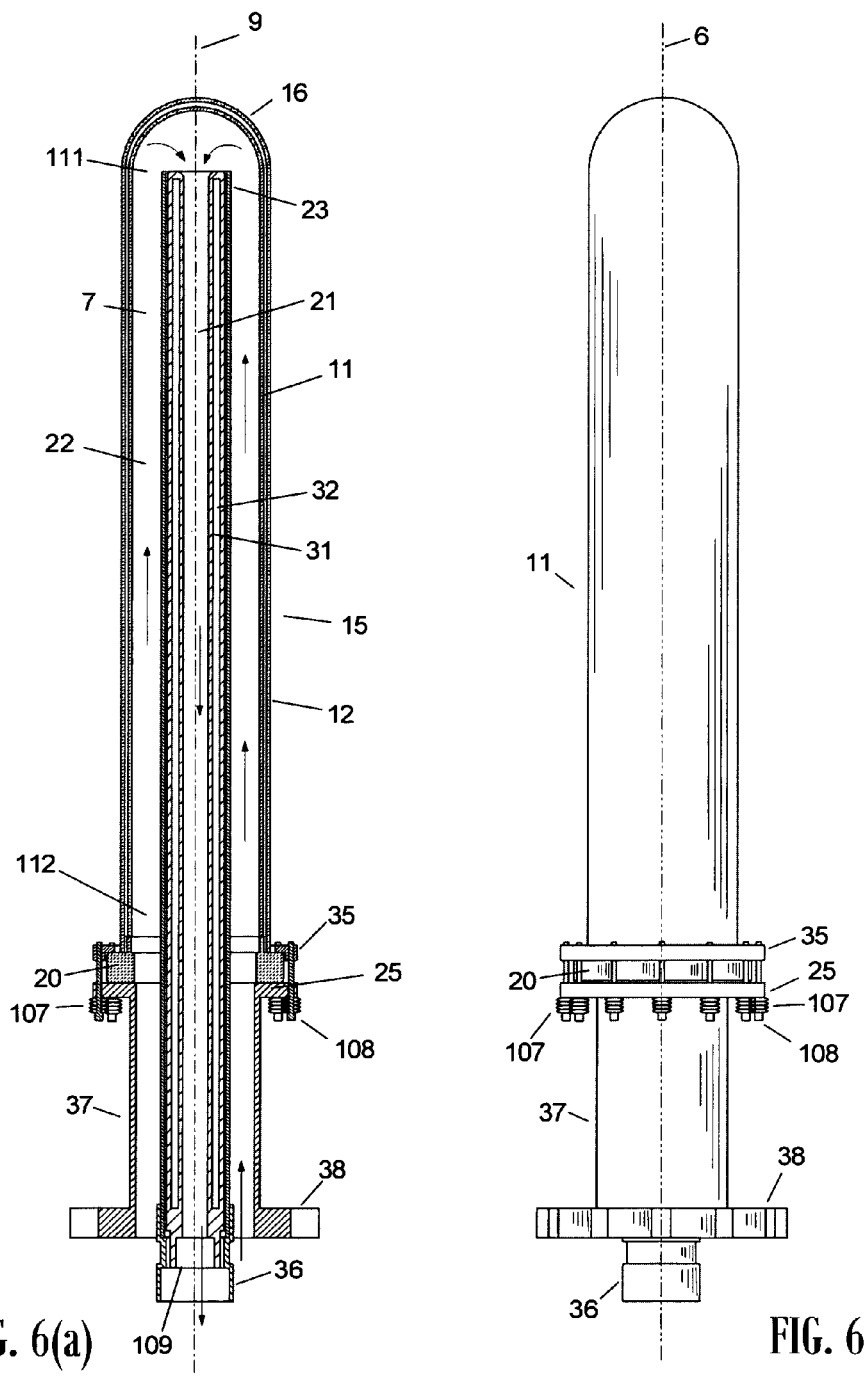

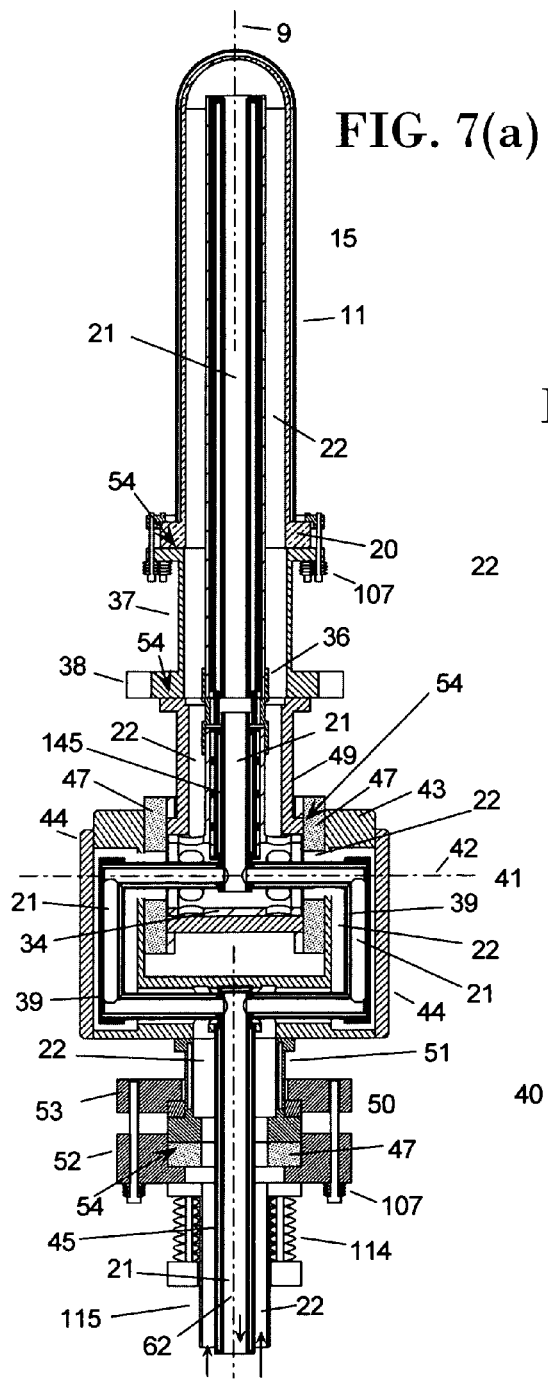
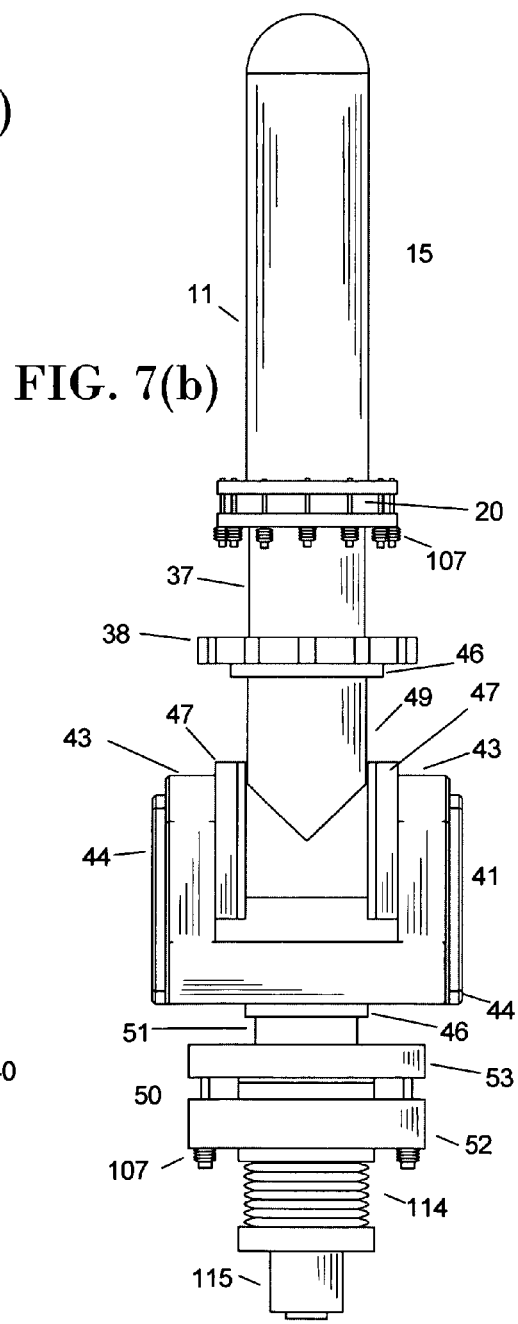
FIG. 7(a)
FIG. 7(b)

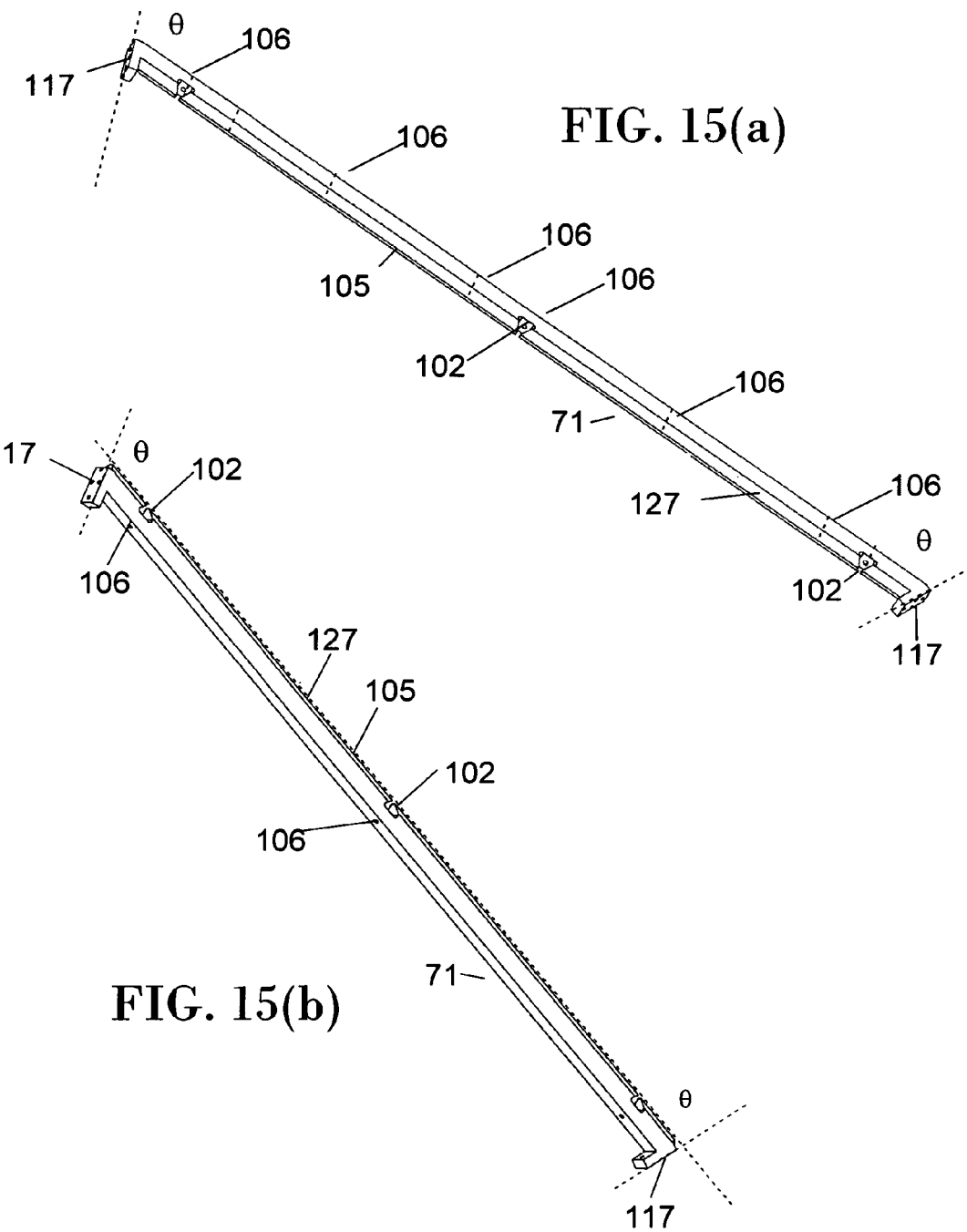

SOLAR RECEIVER AND ASSOCIATED ENERGY CONVERSION APPARATUS

The present invention is related to and claims the benefit of U.S. provisional patent application 61/335,755 (Hilliard), filed Jan. 11, 2010, U.S. provisional patent application 61/337,338 (Hilliard), filed Feb. 1, 2010, and U.S. provisional patent application 61/396,387 (Hilliard), filed May 26, 2010, all of which applications are, in their entirety, incorporated herein by reference. The present invention relates in general to solar-thermal receiver tubes utilized for high-temperature applications, wherein heat energy is provided by an optical concentrator that concentrates solar energy onto a tubular absorber that results in heating of an oil or molten salt that is flowed through the receiver tube.

BACKGROUND ART

Technical Field

There exists a need in thermal-solar applications for maximizing efficiency with which collected solar radiation is converted into heat within the thermal transfer medium. Existing technologies that operate with high temperature fluids such as oils and molten salts, are capable of providing the inherently greater thermodynamic efficiencies that accompany a greater temperature delta in any given energy conversion system. However, as solar-thermal receiver tubes are operated at higher temperatures, particularly above 500C, emissive losses at the receiver tube can significantly diminish the ability of the system to transfer heat into the working fluid. Companies such as Archimedes, Schott, and others have approached this problem by designing specialized multilayer cermet coatings that provide tailored emittance properties, so that optical absorption is maximized, whereas the thermal radiation of such coatings is significantly lower than the emittance of an ideal black body (with epsilon, $\in$, equal to 1).

A problem with these aforementioned technologies that use metal receiver tubes with tailored-emittance coatings is that, whereas emittance of such coating may be relatively limited, such advantages are mitigated by the poor thermal conductivity of the materials system. For example, the advertised receiver tubes of Archimedes, for molten salt operation, employ a stainless steel receiver tube of 40 mm diameter, which is advertised to provide operation, at 580C, with an emittance of less than 14%. However, the thermal conductivity of such stainless steel receivers will typically be less than 18 W/K-cm, and the typical molten salt utilized in such receivers has a thermal conductivity that is much smaller still. Combined with the emitted thermal radiation of such tubes at greater than 500C, in accordance with Kirchoff's Law, a significant fraction of the thermal energy deposited at the absorbing outer coated surface of such tubes will be re-radiated, not primarily because of practicably poor emittance properties of the coating, but because of the poor thermal conductivity of the materials, and resultant thermal gradient between the absorbing coating and the thermal transfer fluid. Due to the poor thermal conductivity, a thermal gradient will exist between the outer coating and the average temperature of the thermal transfer tube, such that the outer coating will be a significantly higher temperature than the tube, and the tube will operate at a significantly higher temperature than the mean temperature of the molten salt. As a result, considerably greater length of trough reflectors, and thermally radiating receivers, is required simply to overcome inefficient coupling of heat into the liquid; and, also, such a thermal gradient militates for an accordingly higher temperature—and radiative thermal loss—than what is required simply by the achieved fluid temperature. Such temperatures in excess of the desired fluid temperature also lead to unnecessarily accelerated degradation of prior art receiver's surface and coatings.

In addition, such receiver tubes of the prior art rely on the absorption or solar radiation to take place primarily in the thin film—or in some cases, thick film—coatings on the outside of the receiver tube. This creation of immense heat within this accordingly very small volume of the coating requires that the receiver tube operate in a highly non-equilibrium manner, wherein the intense creation of heat within these very thin layers results in micro-scale thermal differentials that are not readily anticipated or accounted for by normal mathematical/physical models (e.g., standard FEA programs) used to model such solar-thermal systems. As a result, whereas manufacturers of such prior art receivers may obtain NREL certification of the tube's emissivity, such certifications are, by definition, a certification of the receiver tube in thermal equilibrium, at the temperature tested. However, the actual operation of the tube will necessarily require that the outer-most absorbing layers of the tube experience considerably higher temperatures than the overall temperature of the tube for which the NREL certification was obtained. Such non-equilibrium not only incurs uncertainty in the actual operational emissivity of the tube, it also incurs operational difficulties in the materials stability and adhesion of these outer coatings, and furthermore, raises difficulties in establishing confidence that the specified absorption properties within the outermost layers of these prior art receiver tubes will not be significantly altered under the highly non-equilibrium conditions that exist during actual operation. It may be noted that the NREL certification of these prior art receiver tubes is typically in regards to the emissivity only, but not to the absorption properties. This is understandable, given that such absorption properties are not as easily established as an equilibrium emissivity, and will typically be dependent on the temperature of the absorbing layers; and, with the high power deposition realized in these thin, outermost absorbing layers of the prior art receiver tubes, nonlinear absorption effects and fluorescence are also quite likely, incurring additional operational uncertainty.

Another problem with such prior art receiver tubes is the proposed ability to tailor emissive properties of, typically cermet, coatings is problematic, since, whereas these coatings may provide impressively high IR (infrared) reflectance and simultaneous high optical absorption, this is typically done so by way of imbedded metallic particles within a ceramic coating. However, the high IR reflectivity and low emissivity of imbedded metallic particles does not necessarily serve to contain thermal radiation when the metal particles are disposed underneath an outermost layer that will begin incandescing at the desired operating temperature. In this case, whereas the cermet may spectroscopically provide its desired function of low emittance and high IR reflectivity, it will also serve to reflect (rather than prevent) emission events that take place in the outermost layer. Unfortunately, it is typically the outer-most surface layer of such coatings (and usually external to imbedded metal particles) that dominates thermal emission (e.g., a thin oxide on a very-low-emittance polished metals is seen to often more than quadruple their emissivity), so that, while the imbedded metal particles may retain the desired metallic properties, the critical emission of IR from the outer-most surface of the coating is not subdued, but instead, further reflected, by such interior metal particles. As a result, it may be seen that these specialized coatings, while providing the desired optical absorption, have been only marginally successful in driving emissivity values below the corresponding emissivity of the outermost (usually low-emissivity) layers—e.g., alumina—of these multilayer coatings. Also, again, because of the non-equilibrium operation of the receiver tube under practical operating conditions, the rated (equilibrium) emissivities of these coatings will not necessarily equate to the emission from the relatively hot outermost layers under actual operating conditions.

An additional factor frustrating efficient coupling of heat to the thermal transfer fluid is simply the long-standing practical difficulty associated with coupling heat into a cylindrical volume of flowing liquid that is of poor thermal conductivity, such as water, oil, or molten salts. These problems have been addressed in many applications, involving water and oil, by fabricating carrier tubes with many turbulence-creating features formed in the tube interior. However, in the case of utilizing higher temperature fluids for solar energy-collection efficiency, where it is critical to avoid increasing pressure differentials and minimize system costs, such turbulence-creating features inside the receiver tube would introduce inhibitive operating costs, and candidate materials for such features are inefficient anyway, due to the low thermal conductivity of such candidate tube materials.

DISCLOSURE OF INVENTION

The present invention is disclosed as a means to circumvent these limitations of the above solar receiver tubes. Accordingly, the present embodiments provide means whereby the very poor thermal conductivity of suitable construction materials and suitable heat transfer fluids acts as an advantage, and works for, the objectives of increasing solar receiver efficiency, rather than working against such objectives, as is the case in the prior art receiver tubes.

Such objectives of the present invention are accomplished by implementing a receiver tube design that realizes a temperature gradient, between tube outer surface and transfer fluid, that is opposite with respect to the thermal gradient provided in receiver tubes of the prior art, so that a transfer fluid of the inventive receiver tube runs at a substantially higher temperature than the outer (emitting) surface of the tube.

In its first embodiment, the invention comprises a receiver tube that incorporates a fused silica—or fused quartz—inner receiver tube, wherein such inner tube is substantially transmissive to the solar spectrum (around 0.3-2 micrometers), and the desired optical absorption means are preferably disposed within the interior of the tube. Rather than a cermet coating, the embodied receiver tube is instead coated with a low-emissivity interference filter that is substantially transparent to the solar spectrum, and that comprises materials, such as thin film alumina, zirconia, and magnesia, that provide emissivities that are comparably low to those of the prior art cermets above 500C, preferably around epsilon=0.05-0.2.

Such fused silica tubes are available and regularly used for 300-1000C operation in the semiconductor industry, so that a well-established supply chain is available. Since fused silica is prone to devitrification above about 1000C, its use in thermal solar applications involving temperatures higher than 1000-1100C can be problematic; however, operation of the presently disclosed invention is preferred to be in the range of 300-1000C, and more preferably 500C-1000C, though the subsequently embodied coatings of the invention may serve to prevent devitrification at higher temperatures than 1000C, and temperatures of the heat transfer fluid can run significantly hotter than these specified tube wall temperature in the preferred embodiments.

The conversion of the solar radiation into heating of the transfer fluid is preferably accomplished by the modification of the heat transfer fluid so as to comprise a moderately dense absorber of radiation in the solar spectrum, particularly in the spectral region of 400 nm to 2000 nm, so that uniform heating of the fluid is realized, and the aberrational focus of a typically employed trough-reflector is directed into a large absorbing volume within the fused silica receiver tube; whereas, the embodied absorbing fluid is also substantially similar in projected area to that of coated stainless steel receiver tubes of the prior art. Such absorbing characteristic is preferably accomplished through means of mixing optically absorbing media into the thermal transfer fluid. In the first preferred embodiment, coatings are fabricated in accordance with the techniques developed and well-explored in the paint industry, so that a coating is first formed on a sacrificial drum, after which it is removed and pulverized. In accordance with these prior art techniques, the coatings pulverized coatings are designed primarily to provide a desired optical characteristic. In the present invention, the optical characteristic of the pulverized coating would be to maximize absorption of the solar spectrum, and preferably, provide high reflectance in the infrared, though any sort of thermal emission at the resulting liquid-solid interfaces play a relatively minor role in the preferred non-equilibrium operation of the embodied device.

Alternatively, the thermal transfer fluid can be modified in other ways, such as by introducing carbonaceous materials such as fine graphite powder, or other effective dye materials. In some cases it may be practical to modify the chemistry of the molten salt or other utilized thermal transfer fluid, wherein additional atoms, molecules, or ions derived from metallic, metalloid, or non-metallic compositions are added so as to advantageously increase optical absorption of the transfer fluid. In some cases, the desired absorption may be realized simply by leaving in the original mineral impurities of the mined salt (e.g. "black" or "brown" salts).

Thermal expansion: Since it is preferred that the inner tube is a low-expansion fused silica material, and the outer vacuum barrier tube be a similar low-expansion glass—e.g. preferably fused silica, or alternatively borosilicate—it may be appreciated that there is no requirement of expensive glass-metal seals employed for the purpose of handling differences in thermal expansion between the receiver tube and vacuum barrier tube. As a result, in a preferred embodiment, the receiver tube assembly is manufactured as a monolithic assembly. Such assemblies are preferably terminated at connecting ends by a fused silica, or other low-thermal-expansion flange material, as has been commonly implemented in manufactured quartz furnace tubes in the semiconductor processing industry.

A primary advantage of the embodied receiver tube is its ability to much more efficiently couple heat into a thermal transfer fluid, with respect to metallic receiver tubes of the prior art. Depending on the particular operating temperature, such efficient coupling will result in significantly less trough length, less solar collecting area, and smaller footprint. In some cases, the embodied fused-silica receiver tubes may be utilized in the same thermal-solar plant with metal receiver tubes, wherein the embodied receiver tube is utilized in higher-temperature regions of the fluid path in the solar trough system, particularly where the heat transfer fluid is heated to its maximum operating temperature, and where emissive losses become increasingly significant.

Another objective of the present invention is to implement an absorbing rod, tube, or other solid body disposed along the central axis of the receiver tube, within the interior space of the receiver tube, so that the heat transfer fluid flows within an annular volume thereby formed between the central absorbing body and inner walls of the receiver tube. The optional central absorbing body provides maximum absorption of the solar radiation spectrum, so that the absorbing body is an effective heater for centrally heating the heat transfer fluid under operating conditions, and so that the central absorbing body provides additional means for maximizing ΔT, as well as preferably residing at the most energetic irradiance from the trough-reflector's focus, where a greater optical density than that provided by the absorbing fluid may be found advantageous.

In yet another embodiment of the invention, the structures and operational principals of the preceding embodiments are utilized in a solar-activated photochemical reactor. The high thermal gradients realized in a heat transfer fluid (HTF), particularly in molten salt HTF's, allows for exceedingly high temperatures to be sustained, >1000 Celsius, relative to those normally associated with operational solar receiver tubes. Such high sustainable temperatures are advantageous for promoting photochemical and thermochemical reactions in or adjacent to the hot zones of the receiver tube's interior. Many processes as various photocataltic reactions, including dissociation and degradation, as well as thermocatalytic processes are thus enabled by such achievable temperatures in trough-type solar system.

In another preferred embodiment, the disclosed solar receiver apparatus is configured so that solar radiation is converted into a preferred optical emission by, preferably, fluorescence of a constituent in the transfer fluid. In this embodiment, the receiver tube is coated with a narrow-band interference-based reflector that provides a high confinement of the preferred emission, so that at normal or near-normal incidence reflections experience a high cavity quality factor, Q, in accordance with laser cavity physics. In the highly concentrated solar irradiance of the preferred trough-reflectors, effective irradiance is preferably provided to effectively pump such fluorescent constituents into stimulated emission, which is induced primarily by the high Q propagation of such fluorescent emission within the cavity, at or near normal-incidence with respect to the tube—or cavity walls. The present embodiment thus provides a means to convert highly divergent and spectrally broad sunlight into spectrally narrow optical wavelengths with low divergence that are consequently highly confined within the receiver tube. The relatively low divergence of the coherent, high brightness propagation within the tube is also conveniently directed uniformly toward the center of the receiver tube, where various photochemical processes may be conducted as essentially an intracavity absorption process. In this way, an economically viable means of implementing high-brightness sources for industrial materials processing and fluid treatments is introduced, rather than high brightness illumination sources being of the very low efficiency provided by commercial lasers—e.g., 0.5-5% efficiency, with cooling equipment—a high-brightness materials processing source is realized in the operation of a solar-thermal installation, thus comprising a novel form of combined-heat-and-power (CHP).

An according advantage of the present invention is that, utilizing highly non-equilibrium thermal dynamics of the preferred embodiments, normal limitations of black-body thermodynamics limiting prior art receiver tubes can be effectively overcome, and so that, in the present invention, the normal thermodynamic constraints of Kirchoff's Law can be effectively circumvented.

Another objective and advantage of the disclosed receiver tube is to maximize the temperature gradient between the heat transfer fluid within the receiver tube and the outer surface of the receiver tube, but in a reverse order of the normal thermal gradients of prior art receiver tubes.

Another advantage of the present invention is that optical absorption properties of the heat transfer fluid can be altered for time-of-day, time-of-year, and global location, simply by introducing an appropriate optically absorbing, heat transfer fluid into the system, or altering a fluid-born absorption media within the existing heat transfer fluid.

Another advantage of the present system is that life-cycle of the equipment is not limited by aging characteristics of an absorbing coating or a location-specific optimization of such absorbing coatings.

Another advantage of the present system is that optical absorption properties of the solar-thermal system can be made solely, or in part, by modification of the thermal transfer fluid, so that the absorption properties can be continuously improved within a given system.

Another advantage of the present system is that linear thermal expansion of receiver tubes is less than around 1/20 of current stainless steel receiver tubes.

Another advantage of the present invention is that total linear thermal expansion of system is additionally reduced due to the substantially reduced length of receiver tube required for a given required temperature rise in the thermal transfer fluid.

Another advantage of the present system is that numerous glass-metal seals are avoided.

Another advantage of the present invention is that it provides means for continuous optical monitoring of the transfer fluid properties as end-point control for modifying other operational variables of the system.

Another objective of the present invention is to provide a single-ended solar-thermal receiver tube that comprises substantially pure silica that is relatively free of —OH bonds, so that absorption is minimized in the fused silica portion of the receiver tube, and heating is provided within the volume of an annular HTF flow passage.

Another objective of the present invention is to provide a demountable, single-ended solar-thermal receiver tube that has an absorbing length of less than 2 meters, the absorbing length heating an HTF at heat displacement rates of over 30 kW.

Another objective of the present invention is to provide a solar-thermal receiver tube that shares two axes of rotation with a compound conical concentrator that is disposed for irradiation of the receiver tube.

Another objective of the present invention is to provide a solar-thermal receiver tube assembly incorporating supply and return connections in a first end of the tube assembly for a HTF loop within the tube, and an opposite end that is sealed, the receiver tube assembly providing a thermal gradient in the HTF, along the length of the tube, of greater than 100 degrees Celsius per meter.

An objective of the present invention is to provide a solar-thermal receiver tube assembly incorporating supply and return connections in a first end of the tube assembly for a HTF loop within the tube, and an opposite end that is sealed, such that HTF in the region comprising the sealed end is at least 700 degrees Celsius.

Another objective of the present invention is to provide a solar-thermal receiver tube assembly incorporating supply and return connections in a first end of the tube assembly for a HTF loop within the tube, and an opposite end that is sealed, the receiver tube assembly providing a thermal gradient in the HTF, along the length of the tube, such that the HTF is hottest at the sealed end of the tube.

Another objective of the present invention is to provide a solar-thermal receiver tube assembly incorporating supply and return connections in a first end of the tube assembly for a HTF loop within the tube, and an opposite end that is sealed, the receiver tube assembly having an annular passage that receives direct solar radiation, the receiver tube assembly having an insulated return passage located along the central axis of the receiver tube.

Another objective of the present invention is to provide a solar-thermal apparatus that irradiates the length of a solar receiver tube by way of the receiver tube being positioned with its central axis roughly coincident and collinear with the central axis of a concentric compound conical concentrator.

Another objective of the present invention is to provide a solar thermal apparatus utilizing a compound conical concentrator disposed for concentrating solar radiation along a linear volume centered about the central optical axis of the concentrator, the optical axis roughly coincident with the collected solar radiation.

Another objective of the present invention is to provide a solar-thermal receiver tube assembly wherein the receiver tube is positioned so that it is irradiated by the concentrator with optical rays that enter the receiver, within a plane containing the optical axis, substantially with angle θ of propagation, relative to normal incidence, preferably such that $0° \leq \Theta_i \leq 60°$.

Another objective of the present invention is to provide a compound conical concentrator that heats a submerged absorbing media, so as to provide heating of molten salts to temperatures greater than 700C, and preferably greater than 900C.

Another objective of the present invention is to provide a compound conical concentrator having demountable frustums that are stacked and aligned through pre-determined alignment features.

Another objective of the present invention is to provide a compound conical concentrator that is composed of stacked sections of cones that provides higher concentration than 300 suns and uses flat reflector material in its construction.

Another objective of the present invention is to provide a compound conical concentrator providing high optical flux to a cylindrical volume of length, h, wherein $0.01D < h' < 0.3D$, and more preferably, $0.05D < h' < 0.18D$.

Another objective of the present invention is to provide a compound conical concentrator constructed substantially from flat reflector material including such material originating from roll-to-roll manufacturing.

Another objective of the present invention is to provide a compound conical concentrator that comprises between three to twenty-five conical sections, and preferably between five and ten conical sections, each with its locus of concentration residing in the bottom half of the concentrator, along a relatively short linear volume that is coaxial to the concentrator's optical axis.

Another objective of the present invention is to provide a compound conical concentrator that comprises a coaxial assembly of three to twenty-five conical sections, and more preferably between five to ten conical sections wherein a tubular receiver is provided for heating of a solid submersed in a HTF within the receiver tube.

Another objective of the present invention is to provide a solar-thermal receiver tube assembly that comprises a dual-purpose hot finger assembly that is utilized for simultaneous generation of hot fluid and electrical generation.

In a preferred embodiments of the present invention comprise a compound conical concentrator that comprises a coaxial assembly of three to twenty-five conical sections, wherein the concentration of light is provided for illuminating a coaxial tubular receiver, and wherein an effective concentration, at an absorbing surface of the receiver, is provided such that the concentration is between 200 and 1200 suns.

Another objective of the present invention is to provide a compound conical concentrator, having an effective aperture diameter D, that comprises a coaxial assembly of N conical sections, wherein N is a number such that $3 \leq N \leq 100$, wherein the concentration of light is provided for illuminating a coaxial tubular receiver, and wherein the length, h', of the optically absorbing portion of the tubular receiver is constructed such that $0.01D < h' < 0.3D$, and more preferably, $0.05D < h' < 0.18D$.

Another objective of the present invention is to provide a compound conical concentrator with optical axis irradiating an absorbing body, the body comprising a substantially cylindrical element coaxial to the concentrator axis, the concentrator having an effective aperture diameter D, that comprises a coaxial assembly of N conical sections, wherein N is a number such that preferably $3 \leq N \leq 100$, wherein the concentration of light is provided for illuminating a coaxial tubular receiver, and the concentration factor C in suns is such that $100(0.5N) \leq C \leq 100(2N)$.

Another objective of the invention is to provide a compound conical concentrator that heats an HTF by means of absorbing particles suspended in the fluid, the HTF flowing through a central fused silica tube and provided at temperatures greater than 700C.

Another objective of the invention is to provide a compound conical concentrator that heats an HTF by means of an absorbing element suspended in the fluid, the HTF flowing through a central fused silica tube and provided at temperatures greater than 700C, the distance between element and fused silica of the tube between 0.1 centimeters and 1.0 centimeters.

Another objective of the present invention is to provide a compound conical concentrator that is constructed from linear elements, and wherein circular aspects are provided by uniformly tensioning a portion of the linear elements so that the linear elements conform to the desired circular aspects.

Another objective of the present invention is to provide a compound conical concentrator disposed concentrically to its optical axis irradiating an absorbing body, the body comprising a substantially cylindrical element coaxial to the concentrator axis, a planar window disposed over the concentrator and orthogonal to the optical axis, such that entering solar radiation roughly parallel to the optical axis is anti-reflected by the window, whereas infrared emitted by the absorbing body and propagating roughly parallel to the optical axis is reflected by the planar window.

Another objective of the present invention is to provide a compound conical concentrator disposed concentrically to its optical axis, the concentrator comprising multiple conical surfaces disposed to reflectively irradiate an absorbing body, the body comprising a substantially cylindrical element coaxial to the concentrator axis, the body mounted on a rotatable union having two axes of rotation allowing tilt and pivot, such that the concentrator and body tilt and pivot on the same axes, and wherein the axis of tilt is located outside of and below the concentrator's reflecting surfaces. A compound conical concentrator is provided wherein stacked frustums provide optical tolerances of <0.1° divergence by means of alignment against a series of circular and linear elements.

Another objective of the present invention is to provide multi-junction photovoltaic assembly comprising a plurality of multi junction photovoltaic modules mounted on a cylindrical element with a polygonal aspect approximating the circular aspect of the cylindrical element, the assembly supported by a plurality of linear bars providing alternatively current buses for front-side and back-side contacts to the multi-junction modules, and wherein the assembly is mountable inside a glass tube for illumination by a trough or compound conical concentrator of the present invention.

Another objective of the present invention is to provide tubulated multi-junction photovoltaic assembly providing several kilowatts to several tens of kilowatts from a single such tubulated assembly having a single connecting end having supply and return connectors for coolant, as well as bi-polar electrical connection, wherein the assembly comprises a coaxial arrangement of an outer region of multi-junction arrays, an intermediate region comprising coolant flow passage and integral current bus bars, and an inner region for coolant passage communicatively connected to the intermediate region at the end of the coaxial assembly opposite the connecting end.

Another objective of the present invention is to provide a compound conical concentrator that is capable of providing solar pumping of a laser gain medium thereby providing a solar-pumped laser, wherein a linear gain medium is irradiated with incoming solar radiation that propagates parallel to the gain medium, which radiation is concentrated to transversely pump the gain medium.

Another objective of the present invention is to provide a compound conical concentrator that is capable of providing irradiation of a fluorescent medium for providing a solar-pumped laser, wherein a resonator is disposed along the optical axis of the concentrator, so that solar radiation entering the concentrator parallel to the optical axis is concentrated by the conical sections into the fluorescent medium.

BRIEF DESCRIPTION OF DRAWINGS

FIG. 6(a-b) is a (a) side-sectional and (b) front view of a single-ended, tubulated solar receiver of the preferred embodiments, wherein side-sectional view 6(a) is taken through plane (6) in front-view of 7(b).

FIG. 7(a-b) is a single-ended, tubulated solar receiver and integrated 2-axis rotating union in accordance with the preferred embodiments, comprising a (a) front-sectional and (b) front view, wherein section is taken through central axis (9) of receiver tube and normal to plane (6) in FIG. 6.

FIG. 15(a-b) is a perspective view of angle-forming support struts used (a) in construction of an external frame frustum, and (b) in construction of an internal frame frustum, in accordance with the preferred embodiments FIG. 16(a-b) is a close-up of interlocking features in a conical frustum of the preferred embodiments, comprising (a) side cut-out view, and (b) close-up perspective view.

BEST MODE FOR CARRYING OUT THE INVENTION

Figure 1:
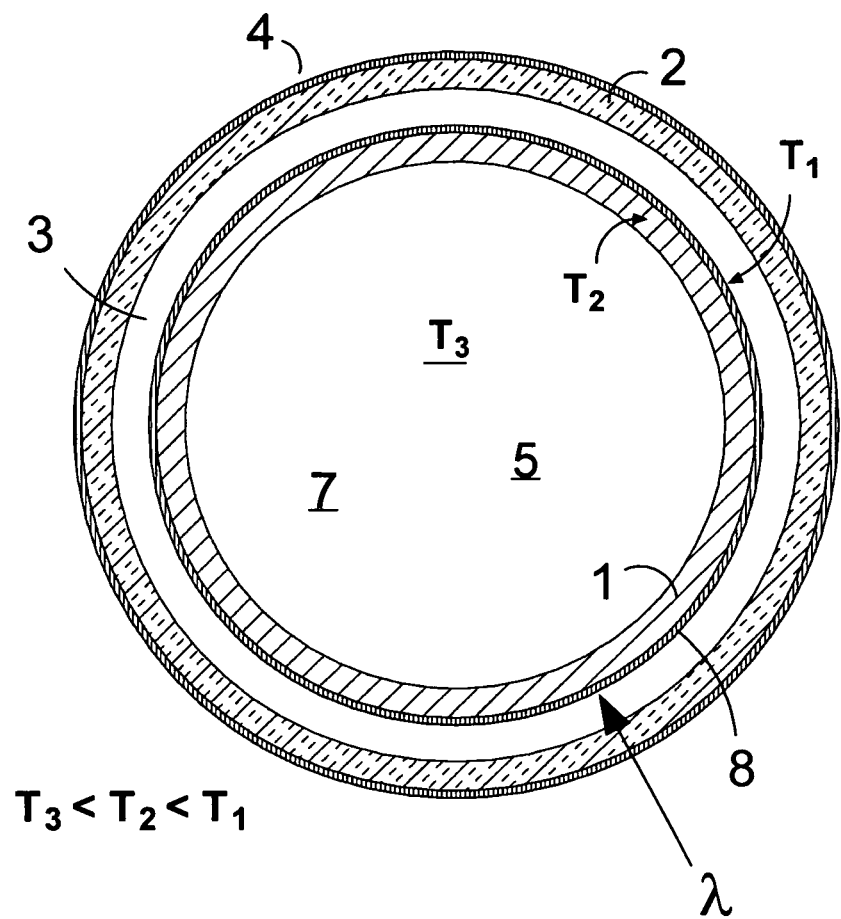
FIG. 1 is a prior art receiver tube, taken orthogonal to the tubes major central axis.

A receiver tube of the prior art, in FIG. 1, typically is provided with receiver tube (1) having low-emissivity outer coating (8), with such outer coating typically designed to simultaneously maximize absorption of solar wavelengths (typically 350-2000 nm, designated by lambda, $\lambda$). The receiver tube itself is typically a relatively high-temperature alloy, such as a stainless steel or other such metallic alloy. The receiver tube typically resides in a vacuum enclosure provided by an integral vacuum barrier tube (2) that is transmissive to the solar spectrum (e.g. borosilicate glass) and separated from the receiver tube by a vacuum space (3) providing thermal insulation. The vacuum barrier tube typically has an anti-reflective outer coating (4). The absorbing coating has many embodiments in the prior art, though cermets and other such composite coatings have become favored for intermediate-temperature applications, where receiver surfaces operate in the 300-1000C range.

Figure 2:
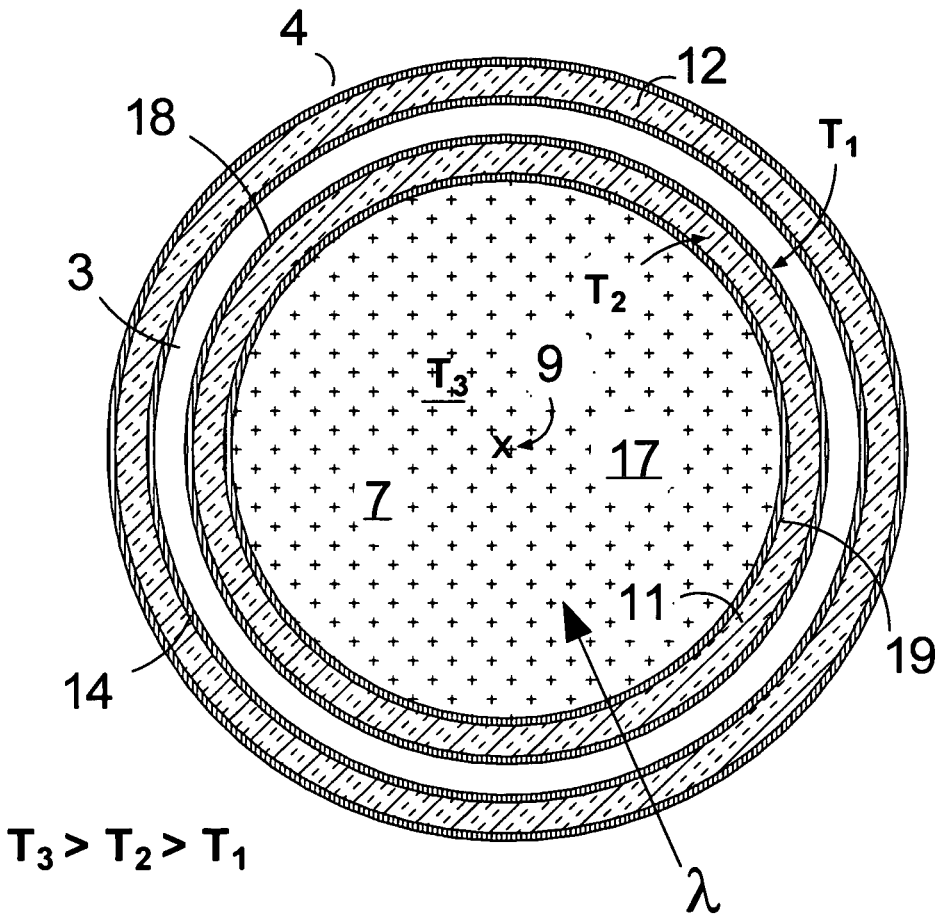
FIG. 2 is a sectional end-view of a receiver tube of the preferred embodiments, taken orthogonal to the tubes major central axis.

Because prior art receiver tubes operate on principal of an outer coating that converts solar radiation into heat, such outer coatings (8) of the receiver tube (1) will operate at a surface temperature $T_1$ that is naturally the highest temperature of the receiver tube. The average operating temperature, $T_2$, of the receiver tube material will be considerably lower than that of the coating, particularly as temperatures rise into incandescent range, and where tubes are constructed of a stainless steel alloy with typically low thermal conductivity. The temperature of the thermal transfer fluid (5), $T_3$, residing in the interior space (7) of the receiver tube will be coolest of these three operating temperatures of prior art receiver tubes. If receiver tubes are manufactured of stainless steels, with thermal conductivities typically in the range of 10-20 W/mK, and the thermal transfer fluid has a thermal conductivity similar to water, and most candidate oils and molten salts, typically less than 1 W/mK, then desirable flow rates will result in a significant temperature delta between these respective component temperatures. An end result is that, as desired output temperatures of the fluid are increased, a greater proportion of the deposited solar irradiance is re-emitted as thermal radiation, with the aforementioned non-equilibrium of the prior art tube incurring a substantial increase of such wasted heat A receiver tube of the present embodiments, in FIG. 2, is preferably an integral all-glass structure in its bulk components (though sealing films and other thin or thick film layers may include ceramic or metallic materials). A transparent receiver tube (11) is preferably transparent to the solar spectrum so as to transmit a substantial portion of solar radiant flux to its interior space (7). The transparent receiver tube is preferably composed of silicon dioxide, and more preferably comprises a polished or otherwise specularly-surfaced tube of fused silica, or alternatively fused quartz or other appropriately transparent glass or ceramic.

In the embodied receiver tube, solar radiation incident on the receiver tube assembly is converted to thermal energy of the transfer fluid by means of absorption of the solar radiation within the transfer fluid itself. As such, the transfer fluid is modified to contain scattering or absorption media that promote conversion of the solar radiation into heating of the thermal transfer fluid. In many cases, this may be accomplished by incorporation of impurity ions or particles in the otherwise nominally pure liquid composition.

A dual-coated vacuum barrier tube (12) is utilized in the present embodiments, the embodied barrier tube having an antireflective coating (4) on its exterior that is preferably a single quarter-wave layer or V-coat centered in the solar spectrum, similar to prior art embodiments, and an interference-based reflecting inner coating (14) on its interior surface. The reflecting inner coating preferably includes a multilayer interference coating that is transparent—and preferably anti-reflecting—to solar radiation in the 0.3-2 um range, and also includes a broad spectral characteristic providing high reflectance in the spectral region of 2-5 micron wavelengths. Such coatings are well-developed in the art of thin film infrared filters, and preferred methods and materials for such coatings are taught in many well-known textbooks, such as *Optical Thin Film Filters*, (McLeod).

The fused silica receiver tube of the preferred embodiments is coated, preferably by sputtering, or alternatively other PVD or CVD methods, with an optically transparent receiver-tube outer coating (18) that possesses a low-emissivity characteristic. Rather than the cermet coatings of the prior art, it is preferred that the present low-emissivity coating be substantially transparent to the solar spectrum, while still retaining a minimum emissivity in the preferred temperature range of 300C-1000C. In particular, it is preferred that the receiver-tube outer coating (18) comprise a sputtered alumina outer layer, with emittance in a region of about 0.1-0.3; alternatively, such outer coating of the receiver tube may be other low emittance materials, such as MgO (magnesium oxide). In another embodiment, the outer coating of the receiver tube may comprise a transparent conductive oxide (TCO) that is reflective in the IR above around 2000 nm, wherein such TCO may be provided by utilizing any appropriate TCO's of the prior art, including, often partially transmissive, high-temperature defective-perovskites and spinels. In another embodiment, the outer coating of the receiver tube may comprise a thermal barrier coating (TBC) comprising microcolumnar zirconia films, as is taught in the prior art of thermal barrier coatings. It may also preferred that the receiver-tube outer coating comprise a second reflective multilayer-interference coating, so that interior layers of the coating would comprise oxide layers of higher, or alternatively lower, refractive index. This second interference coating may provide reflective containment for emission events that take place due to heterogeneous interfaces within the transfer fluid—e.g., fluorescence, emission from ions and particulates in the liquid, liquid-solid interface thermal emission, etc. In yet another alternative embodiment, this second interference coating may be designed to further suppress thermal emission at the outer surface of the receiver tube by interaction with a standing wave thereof.

Contrary to receiver tubes of the prior art, the outer tube surface provided by outer coating (18) of the present invention is maintained, during operation, at a temperature cooler than the interior temperatures of the tube. Temperature $T_1$ of the outer surface, in FIG. 2 of the present embodiments, will be the lowest temperature of the receiver tube. The operating temperature, $T_2$, of the receiver tube fused silica material will be substantially higher than that of the outer coating, particularly as operating temperatures rise into the 700C-1000C range. The temperature of the thermal transfer fluid (5), $T_3$, flowing through the interior space (7) of the fused silica receiver tube will be hottest of these three operating temperatures. Preferably, $T_3$ will be greater than $T_1$ by at least 50 Celsius, and more preferably $T_3 - T_1 \geq 100$ Celsius, wherein $T_1$ is the pyrometrically determined temperature of the receiver tube surface.

In the preferred embodiments, the bulk of the incident solar radiation is deposited as heat in the heat transfer fluid, so that the outer portion of the flowing fluid is relatively cool. The receiver tube is cooler still than the outer portion of heat transfer fluid, with the outer-most surface of the receiver tube having the lowest operating temperature. With the implementation of low thermal conductivity heat transfer fluids, and low thermal conductivity receiver tube materials such as fused silica, as well as an optionally incorporated central absorbing rod, or body, in the fluid path, wherein most solar irradiance is absorbed toward the center of the heat transfer fluid, thermal gradients ($\Delta T$) of the preferred embodiments, measured radially, between the inner thermal transfer fluid and the receiver tube outer surface are preferably such that the outer surface is pyrometrically 100 Celsius cooler than a central temperature of the heat transfer fluid, and more preferably this difference is greater than 300C. Greater $\Delta T$'s are achievable, and a maximum $\Delta T$ of the present invention will, of course, depend upon an adequately high flow rate of the thermal transfer fluid, the particular heat transfer fluid utilized, chosen diameter of the receiver tube, and the size of reflector used.

It is also preferred that the transparent receiver tube (11) have a receiver tube inner coating (19) that is preferably disposed so as to minimize chemical interaction of the thermal transfer fluid with the preferred silica tube material, so that devitrification mechanisms and other modifications of the silica are minimized. Such inner coating of the receiver tube is preferably an inert material substantially inert to the solar spectrum, and matched to the thermal expansion of the silica, such as alumina, or alternatively a fluoride such as barium fluoride or magnesium fluoride. Such materials are preferably deposited on the tube interior by sputtering, or alternatively, a chemical vapor deposition (CVD) method. As with other surface coatings of the invention, the inner coating may also include IR reflective layers and anti-reflective layers for maximizing solar transmission, including but not limited to any such layers or layer combinations of the prior art of optical coatings.

Figure 3:
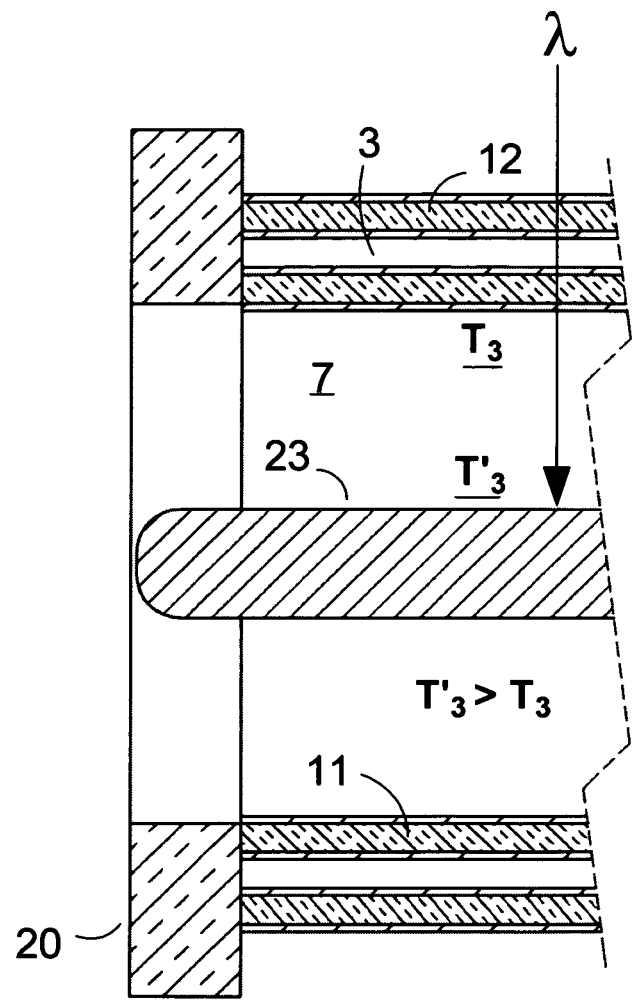
FIG. 3 is a side-sectional view of a receiver tube in a preferred embodiment, taken along the tubes major central axis.

The fused silica receiver tube assembly may be terminated as a fused silica flange (20), in FIG. 3, which is preferably provided for a flat seal to interconnecting elements; or alternatively, as a ground-glass ball joint, wherein such termination is provided in similarly chosen low-expansion glass. In the case that a borosilicate vacuum barrier tube is utilized and sealingly attached to a fused silica flange (20), such seals are preferably performed by proven pulsed-laser glass fusing methods. Evacuation of the vacuum space may be performed in prior art methods comprising sealable evacuation ports. In an alternative embodiment for further inducing a high thermal gradient between the heat transfer fluid and the receiver tube exterior, it may be found advantageous to further implement a solid absorbing element at the central axis of the receiver tube, wherein such central absorbing element is constructed of materials that render it highly absorbing to solar radiation, and preferably reflective to the IR above about 2 um. Such properties are preferably provided by a roughened metallic element such as high-temperature stainless steel with surface etched and roughened, and optionally, photochemically patterned, by ferric chloride; or alternatively by silicon carbide or other carbide, a fit, a boride, or powder-metallurgy-derived material. Whether absorption of the solar spectrum is performed entirely by the absorbing media embodied in FIG. 2, or performed in part or whole by the presently embodied rod element, will depend upon the specific application and design of the thermal-solar system. The central absorbing rod may be mounted within the receiver tube by various mechanical means well-disclosed in the prior art, preferably by thin supporting brackets (24), in FIG. 4. In an alternative embodiment, the central absorbing rod may also comprise a resistive heater material, such as an appropriately coated silicon carbide Glo-bar, or similar resistive heater, so that the heat transfer fluid (such as a molten salt) can be heated electrically by the resistive heater during transitional operation periods.

Figure 4:
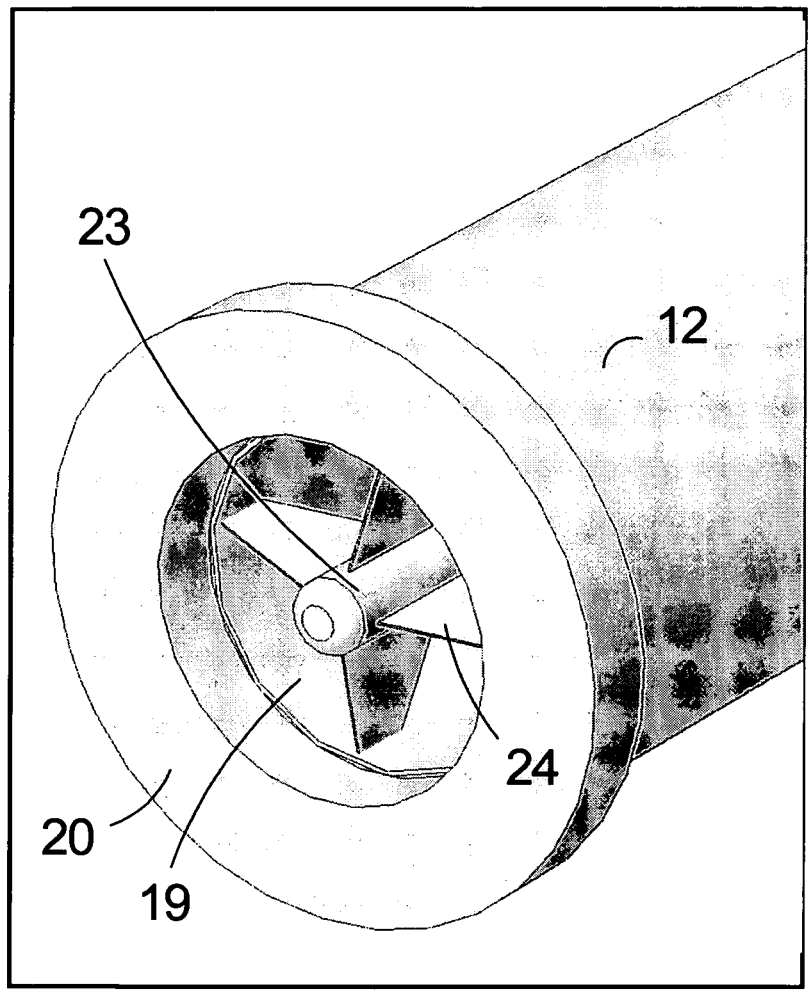
FIG. 4 is a perspective view of a receiver tube in accordance with the embodiments of FIG. 3.

In the embodiments of FIGS. 3-4, the thermal gradient between inner-most and outer-most regions of the heat transfer fluid is preferably such that $T'_3-T_3>50C$, and more preferably $T'_3-T_3>200C$, as measured in a plane orthogonal to the tube's central axis and direction of flow.

As has been earlier embodied, the absorbing body of the photocatalytic reactor, whether it be an optically opaque rod, transparent process tube, or other geometry, can, depending on the materials used, be operated at significantly higher temperatures than the embodied fused silica receiver tube, due to the preferred thermal gradients. As a result of embodied structural features and functions of the disclosed solar receiver apparatus, photocatalytic or thermocatalytic processes that benefit for temperatures of 1200C or greater may be carried out in the volume of the receiver tube.

In a further embodiment, a photochemical reactor is disclosed, which provides a specific operational mode and structure utilizing previous embodiments. It has been realized by applicant that the disclosed receiver apparatus is ideal for performing various photochemical processes, including but not limited to photocatalysis, chemical dissociation, photocatalytic dissociation, photochemical dissociation, various photochemical means of separating water into hydrogen and oxygen, photoionization, and chemically selective molecular excitation of the liquid phase, a gas-phase, or at a solid-liquid interface. In some instances, the disclosed photochemical reactor may be generally regarded as comprising a solar receiver apparatus that increases the Gibb's free energy, or otherwise formulated chemical potential, of the HTF, or other liquid, for energy-conversion processes taking place downstream from the receiver tube. As such, the heat transfer fluid (HTF) may be more generally regarded as an energy transfer fluid (ETF) in the present invention, since energy transferred by the fluid may be thermal energy, chemical energy, or both.

In one preferred embodiment, a photocatalytic reactor—or converter—is disclosed, wherein a photocatalytic process—or alternatively, thermocatalytic process—is preferably realized at the solid-liquid interface that is formed between the absorbing body and an adjacent liquid, preferably a molten salt. Alternatively, such photocatalytic processes may be homogeneous processes that take place entirely within the liquid phase of a liquid within the receiver tube. In the present preferred embodiment, the absorbing body—preferably a cylindrical rod, or alternatively a central absorbing process tube (26)—that is preferably disposed along the central axis (9) of the receiver tube, is comprised of a catalytic material that provides the desired catalytic event. Such a material is preferably disposed as a coated layer, comprising process tube surface layer (27), residing on the outside surface of the process tube that is an appropriately porous material for providing maximum surface area. In some cases, it may be desirable that the central process tube is a porous media that allows migration of a reaction precursor or product through the porous media between the interior space of the process tube and the fluid external to the process tube. For example, heterogenous photocatalytic reduction or degradation may be carried out by the presence of titania in the process tube or process tube coatings. Alternatively, such photocatalysis might be enabled by a suspension of titania powder in the transfer fluid, such as is practiced frequently in the prior art of photocatalysis.

In another embodiment, the photochemical reactor of the present invention is provided with an absorbing body (23) that comprises an optically transmissive process tube at its center, preferably comprising fused silica—that allows optical transmission of preferred spectra into the interior of the process tube. In the present embodiment, the process tube comprises an absorbing body by virtue of a light-absorbing media that is passed through its interior, wherein such media may comprise a liquid, a gas, or a heterogeneous mixture including liquid, solid, or gaseous components.

In yet another embodiment, the disclosed solar receiver apparatus and photochemical reactor is utilized for production of hydrogen. Hydrogen production may be realized by implementation of a well-known photocatalytic layer on the absorbing body, such as titania, or alternatively, any of the various photocatalytic materials of the prior art, including but not limited to titanates, zirconates, ruthenates, niobates, and manganates. Alternatively, the embodied solar receiver apparatus may be utilized in hydrogen production by way of heating an HTF for providing thermal energy to a pre-existing hydrogen-production cycle, such as the sulfur-iodine cycle, or a copper chloride cycle. The present receiver is seen as particularly advantageous for the sulfur-iodine cycle, which requires dissociation of sulfuric acid at 850C or greater.

In another embodiment, the embodied receiver tube may be utilized as a heat exchanger for creating steam in conjunction with a solid oxide electrolyzer that separates water into oxygen and hydrogen, in addition to maintaining the solid oxide electrolyte in a temperature region of fast ion conduction, resulting water-steam temperatures can be provided in the range of 600-1000C so as to allow efficient operation of the solid oxide electrolyzer.

In a further embodiment of the disclosed photochemical reactor, the absorbing body centrally disposed along the central axis may comprise portions that are electrically conductive and disposed to provide electrochemical processes. Such electrochemical processes may include photo-electrochemical processes for separation of hydrogen, or alternatively, reduction of metal oxides, chlorides, fluorides, metal salts, etc within a molten salt. Electrical current may be provided to such processes in a similar manner as it may be provided if the absorbing body were to comprise a heater element; namely by electrical feed-throughs constructed in accordance with the art of glass-metal seals. A preferred embodiment of this configuration utilizes the process tube outer surface layer (27) as a porous electrode and process tube inner layer (29) as a porous counter-electrode, wherein the process tube (26) disposed between these two layers comprises a solid oxide electrolyte, preferably yttria-stabilized zirconia (YSZ), or alternatively, any other suitable solid oxide electrolytic material. As such, this process tube assembly (26) (27) (28) comprises a monolithic electrolytic assembly (MEA) preferably configured as a tubular MEA, the MEA being disposed for splitting water vapor into its constituent oxygen and hydrogen components. In the manner of a normal solid oxide electrolyzer, such an embodied MEA is useful for generation of hydrogen by catalytic splitting of water vapor (steam) at the electrode, and thereby enabling diffusion of oxygen ions through the electrolyte for producing oxygen at the counter electrode, when an appropriate voltage for overcoming a Knudsen potential and associated circuit resistance is applied across the electrodes; thus providing an oxygen and/or hydrogen generation means. In this present embodiment, the process tube interior space (28) is preferably utilized as a conduit for transporting the generated oxygen to a point of use. For further enabling the catalytic processes at the outer electrode, such catalytic materials with known water splitting and photocatalytic characteristics are preferably utilized in the outer electrode (27) composition; namely, titania, titania composites, and may also comprise various perovskites, various titanates, ruthenates, niobates, tantalates, zirconates, or any other suitable catalyst. As such, in the present embodiment, the ETF comprises a solar heated water vapor for raising the thus generated steam to a desirably high temperature, in addition to providing photocatalytic dissociation of the steam at the electrode surface. In this way, the power required to conduct oxygen ions through the solid oxide electrolyte is significantly reduced over prior art apparatus. In addition to providing solar-derived heat in the processed steam, the present embodiment thus provides chemical energy in the form of separately delivered oxygen and the hydrogen-rich steam. In the case of the steam ETF, absorption of solar radiation may be enhanced by various means, such as by increasing the absorption properties of the receiver tube inner coating by incorporation of neutrally absorbing materials; e.g., ruthenium oxide, chromium oxide, boron, DLC, cermets, etc.

As embodied earlier, the outer coating (18) of the receiver tube, as well as other surfaces of the embodied receiver tube, may alternatively include a multilayer interference coating that is specifically reflective to some emission event that takes place within the HTF (or ETF). In certain cases, it will be desirable, or unavoidable, that a substantial proportion of the solar radiation entering the embodied receiver tube will be converted into an optical emission within the volume of the receiver tube. Such optical emission may comprise any physical event resulting in the emission of light, including but not limited to fluorescence, such as from metal ions in a molten salt HTF, and thermally-induced emission, such as from liquid-solid interfaces within the receiver tube. Such emission from the receiver tube may be utilized advantageously, and encouraged, by including a predetermined amount of an emitting substance in the HTF or in the solid phases of the internal components and coatings. In a preferred embodiment, metal ions are included in a molten salt—preferably lanthanoid ions, or alternatively, transition, alkali, or other ions—that are excited by a spectral region of the incoming solar radiation, and consequently, will fluoresce at a characteristic wavelength, $\lambda_2$, of the ion in the HTF. Such fluorescing or otherwise emitting entities are chosen so as to provide a characteristic optical emission that is desirable for carrying out a photochemical process that is enabled by such characteristic emission.

In a preferred embodiment, in the case that the outer coating (18) of the receiver tube includes a multilayer interference coating comprising a narrow-band reflector that is highly reflective to the fluorescent wavelength $\lambda_2$ over some angle $\theta$. Such reflective coating is preferably provided maximum reflectivity at or around normal incidence. As a result of the incorporation of the narrow-band reflectance coating in the outer coating (18), a cavity confinement of the fluorescence wavelength $\lambda_2$ is realized. Such reflective confinement, in combination with the high optical fluence entering the receiver tube by solar means, can result in sufficient optical energy at wavelength $\lambda_2$ residing within the receiver tube such that some degree of stimulated emission results. As a result, such stimulated emission by the reflectively confined propagation will result in preferential propagation of the fluorescence in propagation directions that are confined by the reflector, and so, the setting up of such coherent propagation within the receiver tube can result in a greater efficiency in the tubes ability to contain such fluorescent radiation. In the case that the excited species has a ground state and population inversion is acquired, the relatively high cavity confinement, or cavity quality, Q, for optical energy of the fluorescent wavelength that is propagating at angles of high reflection, due to the narrow-band reflection coatings, will result in a large portion of the fluorescent energy being contained by the receiver tube for performing photochemistry or other useful work, such as up-conversion or down-conversion to other wavelengths. For example, in the case that the central absorbing body is incorporated in the receiver tube, the central absorbing body may comprise a lanthanoid-containing fused silica that is an efficient two-photon absorber, so that emission at ultraviolet wavelengths is provided for any purpose, preferably for providing photochemistry in the receiver volume. In one particular embodiment, wherein the central absorbing body comprises a substantially transparent process tube (26) that allows transmission of the desired wavelengths into the process tube's interior space, such emission is utilized for purification of water that is flowed through the process tube interior space (28).

In this way, the receiver tube of the present embodiment may be considered a coherent light source containing a laser medium that is effectively pumped by solar radiation, and preferably thermally stabilized by the HTF (or ETF). Furthermore, if most emission at some wavelength $\lambda_2$ in the receiver volume is propagating normal to the reflective tube walls, such normal-incidence propagation is also useful for carrying out photochemical processes in a process volume roughly disposed along the central axis of the receiver tube, since such confinement of normal-incidence radiation will accordingly result in a relatively higher optical fluence at or near the central axis. In this way, in a further embodiment, photochemical processes carried out in the interior process space of the process tube may comprise two-photon or multi-photon processes, depending on the relevant time constants of the specific photochemical process. The principles set forth herein may also be applied to differently configured solar-pumped sources of coherent radiation, such as through implementation of end-reflectors that enable a high cavity quality for longitudinal modes with respect to the central axis.

Some features that may be readily incorporated in the presently embodied receiver tube are found in U.S. Pat. No. 6,807,216 (Hilliard), by same author, which is included herein by reference. The previously embodied transparent-receiver-tube embodiments are preferably utilized in a tubulated "hot-finger" configuration comprising a single-ended receiver tube assembly (15), in FIG. 6 that is suited for utilization in concentric solar concentrator dishes. In the present disclosure, the term "hot-finger" will be equivalent to the disclosed single-ended receiver tube assembly (15). The term "single-ended" will herein refer to a structural characteristic wherein HTF return and supply connections of the embodied solar-thermal receiver tube are located at one end of the receiver tube, and no other limitations are implied by this term.

While trough reflectors may also be readily utilized to irradiate the embodied receiver tube in an alternative preferred embodiment, the utilization of the embodied receiver tube in a dish configuration provides a configuration that is readily employed with 2-axis tracking, whereas single-axis tracking is typically more practical in trough systems. Furthermore, the unique characteristics of the embodied receiver tube are inventively utilized in the present invention so that relatively short lengths of the receiver tube are irradiated with total solar fluxes conventionally provided at lower concentration to longer lengths of receiver tube in the prior art trough systems, so that many advantages are realized, including much higher concentration factors, higher achievable HTF temperatures, lower material costs, and lower pump loads are realized in the current embodiments. A primary advantage of the present embodiments is in providing a solar-thermal receiver tube that can withstand continued temperature cycling between operating temperatures in excess of 800, and preferably greater than 900C, and non-operating temperatures that are typically room temperature. For this to be done reliably, it is preferable that the fasteners, metal flanges, and other load-bearing structural elements are substantially removed from the higher-temperature regions of the operating receiver tube assembly. The central absorbing element of the present preferred embodiment is once again a preferably optically absorbing tube (23). Accordingly, the receiver tube assembly of the present embodiments possesses an inner high-temperature region that is preferably the HTF return portion of the receiver tube assembly's fluid circuit. The inner region is preferably insulated from an outer region of the tube assembly by incorporating a multi-walled—double-walled in the preferred embodiment—structure comprising, high-Ni alloy, central insulating enclosure (31) preferably having the aspect of roughly a tube, though any insulated cavity suitable for transporting and insulating the returning HTF may be utilized in the preferred embodiments. The central insulating enclosure is provided with insulating spaces (32) or gaps that separate walls of the double-walled (or triple-walled, quadruple-walled, etc) enclosure that insulate the HTF return passage from the coaxial absorbing tube (23), such enclosures are preferably further insulated by a low-thermal-conductivity gas within the spaces (32) formed within the multi-wall thermal barrier, preferably Argon, which is disposed within the accordingly cylindrical insulating space formed by the preferably tubular double-walled enclosure. Alternatively such thermally insulating space may be provided as a vacuum barrier. It is additionally preferred that the double-walled insulating enclosure have a low-emissivity coating on at least its surfaces that form the insulating space, preferably comprising gold, but alternatively any suitable low-emissivity coating of the prior art. The double-walled enclosure is preferably located along the central axis of the tube assembly, and within the interior of the earlier central absorbing element, so that a central HTF return flow passage (21) is preferably disposed so as to provide a return path for the HTF after having traveled the length of the annular flow space wherein it is preferably heated to its desired high output temperature. Preferably the enclosure is disposed as a tubular element within the central absorbing tube (23), so that the absorbing tube and insulating enclosure may be separately serviceable or replaced.

In the present preferred embodiments, the transparent receiver tube is formed as a monolithic fused silica (or fused quartz) assembly that preferably includes a vacuum layer and outer tube as in previous embodiments. While various high-temperature metal-glass seals and glass-ceramic seals are known and practiced in the prior art (see, for example, well-known texts) is preferred that the transparent receiver tube, outer vacuum tube, and transparent receiver tube mounting flange (20) be constructed from silica, so that no expansion joints are necessary in this monolithic assembly. Thermal expansion differences between the fused silica mounting flange (20) and the preferably metal alloy connecting flange (25) of the mounting nipple are provided for preferably by means of non-binding surfaces provided on the respective mating surfaces of these two flanges, which, combined with the described optical planarization of these surfaces, allows for these surfaces to slide relative to each other during heating and cooling. This is additionally accomplished by means of the compliant tensioning means (107) that are utilized to provide suitable pressure for clamping together these mating surfaces. Preferably the tensioning means comprise Inconel Belleville washers utilized in conjunction with bolts (108) that hold the two flanges together. Tensioning of the Belleville spring washers is preferably such that the total force holding the two flanges together is equivalent to less than 50 lbs. Such light loading is acceptable in the preferred embodiments, wherein the annular HTF passages are preferably maintained at low pressure of less than 10 psi, and HTF flow is enabled by return side pumping of the fluid. The mating of the fused silica flange to the mounting nipple (37) of the embodied hot-finger assembly is accomplished by means of an alloy clamping ring (35) (preferably with silica glass wool padding) and compliant fasteners comprising a plurality of bolts (108) and compliant tensioning means (107). Alternatively, a glass-to-metal seal may be utilized for conversion of the glass receiver tube to a demountable metal flange assembly.

The mounting nipple connecting flange (25) of the mounting nipple (37) is preferably planarized and polished, similarly to the fused silica flange (20), so that mating of the two flanges will be accordingly provided with sub-micron, preferably less than quarter-micron, clearances between the mating surfaces. The mounting flange of the mounting nipple is preferably coated with an inert low-surface energy material that provides minimum reaction with the salt or fused silica, and further additionally impedes any leakage preferably by virtue of a high wetting angle by the molten salt on the coated material. Alumina is preferred for the coating, though a variety of other coating materials may also provide suitable performance, such as boron nitride, titanium boride, zirconium boride, silicon carbide, or diamond-like carbon coatings.

It is preferred that the fused silica flange and other planar sealing surfaces of the embodiments are planarized and polished to surface RMS <5 micro-inches on its external mating surface, with surface figure preferably better than ¼-lambda at standard HeNe wavelength of 530 nm. The flange is typically on order of ¼" to ½" thickness material to provide adequate rigidity.

As in earlier embodiments wherein the preferred HTF of molten salts are being heated by the receiver tube, it is preferred that the inside of the fused silica Receiver tube be coated by a vapor deposition method to provide a diffusion barrier between the silica and the molten salt. Preferred coatings for this purpose are aluminum oxide, chromium oxide, various metal fluorides, As noted previously, the central absorbing tube can be fashioned or extruded with any suitable cross-section to enhance absorption, so that the external surface need not be circular as in the first preferred embodiments. Accordingly, the profile of the central linear absorption element of the embodied solar thermal receiver tube can be a tube or any other profile, such as a star or polygonal shape. In some alternative embodiments it may include an assembly of rods. Alternatively, the supporting fin-shaped brackets of earlier embodiments may extend the length of the embodied absorbing central tube, so that such fins serve both to position the tube within the mounting nipple (37) as well as to extend into the absorbing section of the receiver tube to enhance solar absorption.

Other rotating unions that provide the tilt and pivot rotations required for two-axis tracking may be utilized without departing from the scope of the present invention. For example, it may be adequate in certain circumstances to utilize a universal rotation union provided in the form of a ball-joint, such as provided by mating concave and convex spherical surfaces, similar to ball joints of the prior art, made of appropriate refractory materials that may comprise coated high-temperature alloys, glasses, and ceramics.

The various tube coatings of the preferred embodiments are preferably formed prior to fusing of glass parts to form the embodied transparent receiver tube, though, in an alternative embodiment, the inner transparent receiver tube is attached to the fused silica flange prior to coating, and an outer vacuum tube is not incorporated. The fused silica flange is preferably mated to a metal mounting nipple that, as with other metal structural components of the assembly, is composed of a suitable high-temperature alloy, preferably Incolloy, or alternatively Waspalloy, Inconel 625, etc.

In the preferred embodiments, HTF within the annular passage (22) of the receiver tube is heated by solar radiation propagating through the transparent receiver tube as it travels the length of the receiver tube to its sealed end, at which point it returns back by reversing direction in the hemispheric portion (16) of the tube and passing through the central HTF return passage (21). Accordingly, in the preferred embodiments, wherein the HTF is loaded with an absorbing medium, such as a graphite powder or powdered inorganic coatings, the radiatively exposed HTF will have a considerably higher temperature in the bottom region (112) than it will in the top region (111) of the embodied receiver tube's annular passage (22).

In accordance with the present preferred embodiments, the receiver tube assembly, when positioned in the embodied concentrating conical concentrators (CCC's) of the present invention, provide for heating of an HTF to temperatures in excess of 800C, and is preferably and most effectively employed for heating of HTF's to temperatures in excess of 900C. This is accomplished preferably by supplying the HTF at suitably liquid temperatures and pressure to the outer annular passage of the receiver tube, so that a processed volume of the HTF travels up the annular passage to the hemi-spherically sealed end (16) of the receiver tube assembly, where it then reverses direction to return though the central insulated passage formed by the insulating enclosure. A slip-fit, absorbing tube interconnect fitting (36) preferably constructed from metal alloy is utilized to join the absorbing tube (23) to vertical tube extension of a perforated retainer sleeve within a preferred adjoining rotating union, or an appropriate connector on an alternative connecting component.

Due to the very high concentrating capabilities (preferably greater than 500 suns) of the embodied CCC (70), it is embodied that the solar flux into the embodied receiver tube will provide for a desired temperature increase of the HTF volume within a relatively short travel distance, relative to thermal receiver tubes of the prior art, so that the embodied receiver tube assembly is quite short (preferably less than 2 meters in length), while enabling a temperature rise of typically 100-450C within the short travel distance of the HTF volume within the embodied annular passage. Preferably the travel velocity of the HTF is such that a given HTF volume travels the length of the receiver tube in less than a minute, and preferably in less than 0.5 minutes. Accordingly, a high temperature gradient is formed within this length of traveling HTF in the annular passage, so that it is realized and preferred that the embodied receiver tube provides a linear temperature gradient in the heated HTF within the annular passage of $\Delta T \geq 100C$ per meter, or a temperature difference of greater than 100 Celsius in a meter or less of flow distance.

Figure 5A:
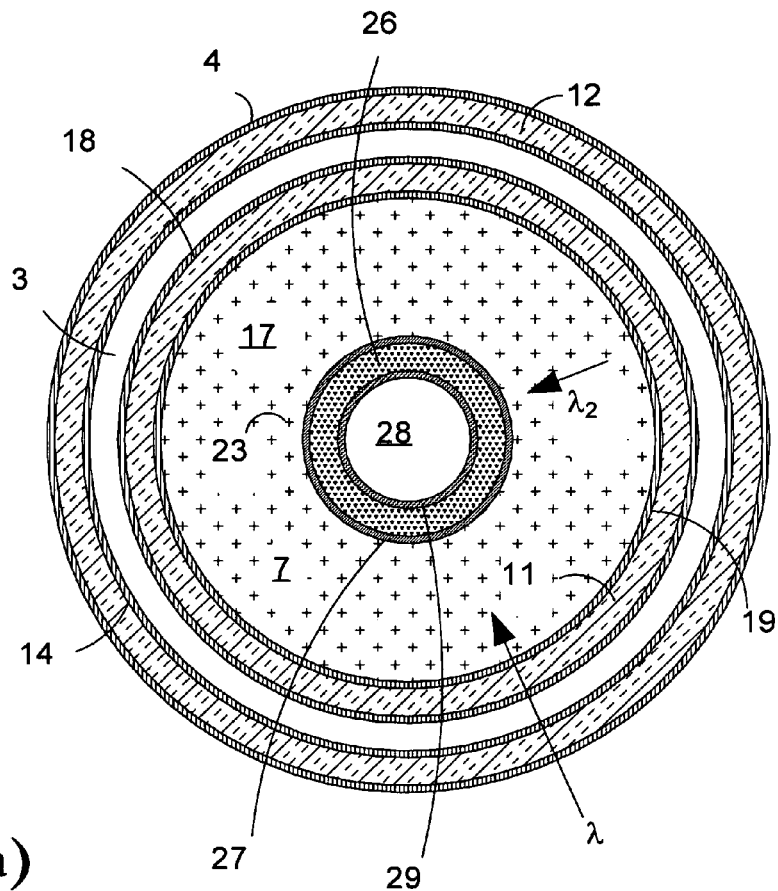
FIG. 5(a-b) comprises (a) a sectional end-view of a receiver tube in another preferred embodiment, as viewed along the tubes major central axis, and (b) various possible cross-sections of absorbing element/tube (23).
Figure 5B:
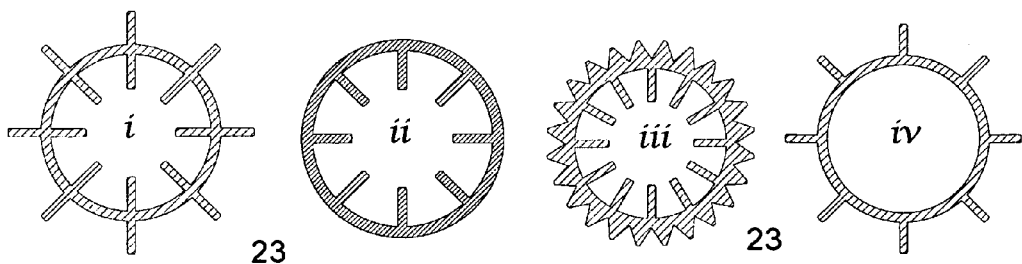
Figure 9:
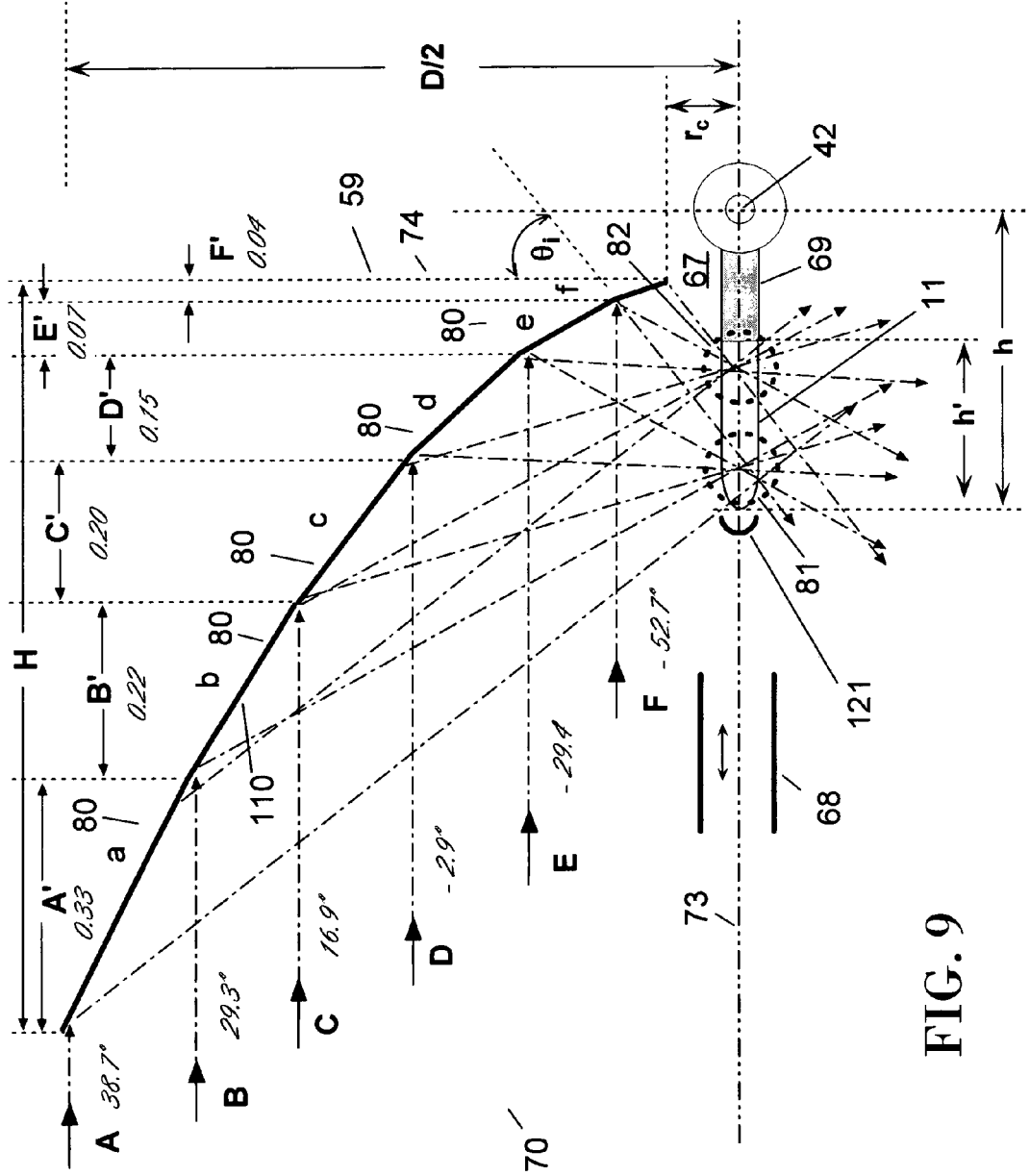
FIG. 9 is a diagram of a single-ended, tubulated solar receiver of the preferred embodiments, integrated with a compound conical concentrator of the preferred embodiments, comprising a N=6 concentrator.

In combination with the absorbing molten salts (a HTF, or "thermal transfer fluid") of the preferred embodiments, the embodied radial thermal gradients due to low salt thermal conductivity (e.g., typically less than 1 watt/m·K), in FIGS. 3-5, and irradiation of the hemispheric end (16) of the hot-finger assembly with top-hat heat-shield, in accordance with the preferred embodiments, in FIG. 9, a solar-thermal receiver tube is realized wherein the heated HTF of the embodied receiver tube is processed to substantially higher temperatures than any emitting surface measured along the linear length of the tube. Conversely, if emissivity of the overall tube is calculated for that of the temperature of the molten salt provided by the receiver tube, the calculated effective average emissivity of the cylindrical receiver tube will result in an effective emissivity of less than 0.05. Since emissivity is by definition an equilibrium measurement, and the present embodiments are by design a highly non-equilibrium device, such emissivity measurements are herein necessarily "effective" quantities.

In this way, the temperature of flanges and fasteners of the receiver tube assembly are maintained at roughly the temperature of the cooler molten salt that is entering the annular passage of the assembly before heating of this salt, whereas the hotter HTF is present at the opposite end of the receiver tube, or else preferably within the insulated enclosure, which preferably sustains less mechanical stress, provides minimal structural bearing functions, and can be encapsulated in an inert gas such as Argon during down-time. HTF's of the invention may comprise any molten salt including chlorides and fluorides, oil, water, a gas, a super-critical fluid, or any combination of these that is suitable as an effective HTF.

The hot-finger assembly (15), in FIG. 6, comprising the transparent receiver tube (11) and outer vacuum tube (12), inner absorbing element/tube (23), any supporting brackets (24), mounting nipple (37), central insulating enclosure (31)

(preferably multi-walled insulated tube), compliant tensioning means (107), and absorbing tube interconnect fitting (36) is preferably incorporated in an assembly that allows pivot and tilt of the receiver tube for two-axis tracking of the sun, preferably wherein the optical axis of the tracked direct sunlight is maintained roughly coincident with the central axis (9) of the embodied receiver tube. Whereas this movement may be provided by alternative rotating unions comprising such solutions as high-temperature, universal ball-joints, it is preferably accomplished by a two-axis rotating union.

The single-ended receiver tube assembly (15) is preferably connected and supported by a 2-axis rotating-union assembly (40), in FIG. 7, which comprises an upper tilt union (41) and a lower pivot union (50). In accordance with the preferred embodiments, the upper tilt union has a horizontal tilt axis (42) for rotational altitude adjustment of the hot-finger in the hot-finger/CCC tracker assembly described later, and the lower pivot union has a vertical pivot axis (62) for rotation of the hot-finger and CCC assembly in the horizontal plane.

The tilt union assembly (41) is housed by tilt union fork (43) providing mechanical function of a tilting axis support similar to that commonly used in telescopes, turret guns, and transits. The tilit union fork supports a rotating portion of the tilt union assembly comprising tilt-union rotating 'T' joint (49) resembling essentially a metal alloy 'T' pipe fitting with precision formed surfaces, wherein the orthogonal portion of the 'T' is connected to the embodied hot-finger assembly by means of an integral sealing flange (46), and the coaxial legs of the 'T' provide are coaxial to the tilt axis (42), so that the attached hot-finger assembly (15) is attached to the rotating 'T' joint so as to provide a rotation by T joint about the tilt axis. Coaxial supply and return passages for the HTF are accordingly provided along the tilt axis similar to dual-flow rotating unions utilized for lower-temperature applications. In the preferred embodiments An inner, perforated retainer sleeve 'T' assembly (34) comprises a retainer sleeve coaxial to the tilt axis (42) and disposed to provide a coaxial positioning between integral sealing flange (46) and the bushing plates (47). The retainer sleeve incorporates a plurality of hole structures for allowing passage of the supply-side HTF into the region of the tilt axis. Additionally, the retainer sleeve also incorporates an orthogonal tubular element that is maintained coaxial to the orthogonal portion of the tilt union's rotating 'T' joint, and provides connection and alignment to the absorbing tube (23) of the hot-finger assembly, via slip-fit absorbing tube interconnect fitting (36). The slip-fit interconnection thus provides a housing and guide for the resistance-fit connection of the exit end of the embodied central insulated return tube (31) of the hot-finger assembly, and a upper pivot-axis insulated tube (145) that provides a return passage for the returning HTF in the rotating 'T' joint of the tilt assembly.

Fluid communication between upper pivot-axis insulated-tube (145) and a lower pivot-axis insulated-tube (45) is provided by insulated-tube return 'C' insert (39), which is removed and installed by way of removing tilt union side plates (44) that sealingly cover and the internally machined fork housing for the 'C' inserts. The insulated C-insert is provided within a similarly C-shaped cavity in the fork, so that the fork houses the C-insert and additionally provides an annular space (22) substantially encompassing the insulated C-insert, so that the embodied annular supply passages and central return passages within the C-insert, are incorporated within the union fork structure (43) for transport of the HTF between the hot-finger assembly and the lower pivot assembly (50).

The rotating tilt union provides fluid passage between the tilted hot-finger assembly and the lower, non-tilting pivot union by means of inorganic rotating seals, comprising precision bushing plates (47), that are disposed coaxial to the tilt axis at either side of the rotating 'T' joint (49) and positioned to couple the tilting 'T' joint to the non-tilting union fork.

The bushing plates (47) preferably comprise coated disks comprising the same alloy as employed in the fork construction, so that thermal expansion is uniform. The bushing plates are preferably polished and planarized to within optical tolerances, so that parallelism of the bushing plates is within 2 microns, and more preferably within 0.5 microns. Similarly, optical flatness of either planar surface of the plates is such that their resulting polished figure is flat to within 0.5 microns. Such polishing methods and tolerances are commonly practiced in the optical and magnetic disk fields, and numerous vendors are available that can provide appropriate fabrication services to produce the embodied bushing plates. It is preferred that the bushing plates are subsequently coated with well-adhering chromium oxide thin film of about 0.25 micron thickness, followed by 100 nm of alumina, so as to act as a diffusion barrier and wear surface in the operation of the rotating unions. Alternative wear surfaces may be utilized, and will depend largely on the chemistry of the preferred molten salt HTF. In the preferred case that the HTF is a chloride salt, or alternatively a fluoride salt, the embodied bushing plate provides suitable corrosion resistance. Likewise, the mating planar surfaces of the 'T' joint that form a rotating interface with the bushing plates are preferably fabricated with similar tolerances and coatings. The embodied rotating unions of the first preferred embodiment are operable on the basis of precisely aligned and parallel bushing surfaces that require minimum mechanical loading due to a high precision in their alignment and microscopic clearances that exist between the rotating union surfaces (54) that rotate with respect to one another. Accordingly, non-rotating surfaces of the fork element 43 the bearing disks are mounted to are surfaced for positioning the bushing plates within 2.5 microns of the adjacent rotating surfaces of the 'T' joint. It is accordingly preferred that the rotating unions of the present invention are assembled in a clean room environment. Alternative coatings utilized are preferably selected from group comprising boron nitride, graphite, silicon carbide, alumina, borides, nitrides, and fluorides.

absorbing tube interconnect fitting (36) provides a union between the embodied absorbing tube that has preferably an optically absorbing outer surface, and the embodied retainer sleeve 'T' assembly (34) of the tilt union assembly. Since this fluid interconnect is preferably coaxial to the outer flow region of the receiver tube, it does not necessarily require a positive seal, so that slip-fit or resistance fit clearance between the interconnect fitting and its respective connecting tube sections is sufficient.

This mounting nipple is preferably constructed from an appropriate metal alloy that is compatible with the operating temperatures of the HTF. In the case that it is a high temperature molten salt, it will be appropriately constructed of Inconel or other appropriate nickel alloy. The mounting nipple may also include an appropriate vacuum or inert gas barrier shielding as is typical in the construction of high-temperature fluid plumbing.

The embodied 2-axis rotating union assembly provides supply and return flow between the solar tracking hot-finger assembly and a stationary HTF connection (115) to a workload (which workload may comprise a steam turbine, Stirling engine, swing-cycle refrigeration and air-conditioning, materials processing, materials refining, electrolytic processing of materials, etc.) benefiting from the solar heating of the HTF. The 2-axis rotating union thus preferably provides two rotating axes for tilt and pivot of the receiver tube, preferably in unison with the attached CCC structure (70).

Figure 11:
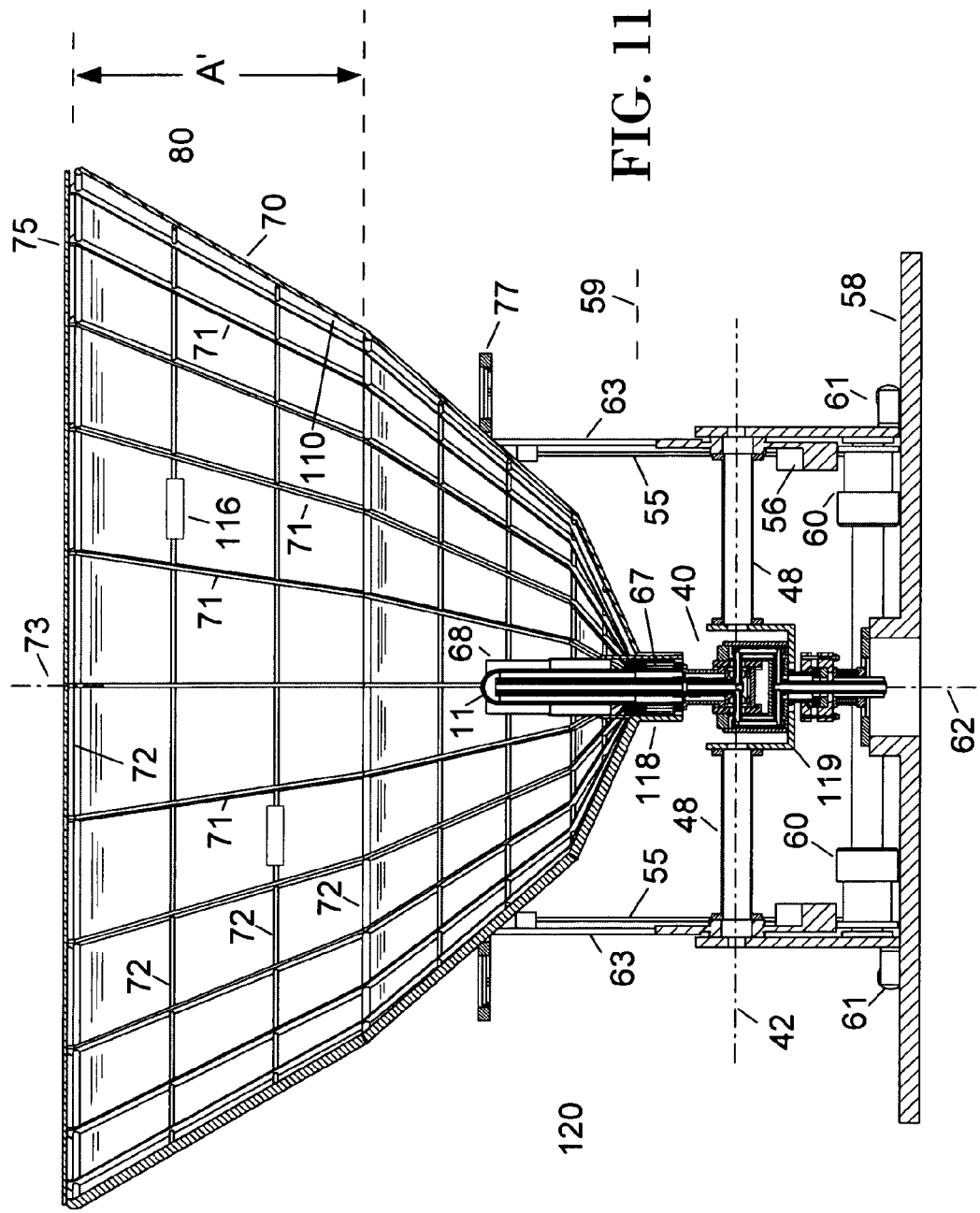
FIG. 11 is a front sectional cut-out view of a solar tracking apparatus utilizing a compound conical concentrator and receiver tube of the preferred embodiments, wherein section is taken along the normal plane containing pivot axis (62), and wherein the receiver tube is aligned to the pivot axis.
Figure 12:
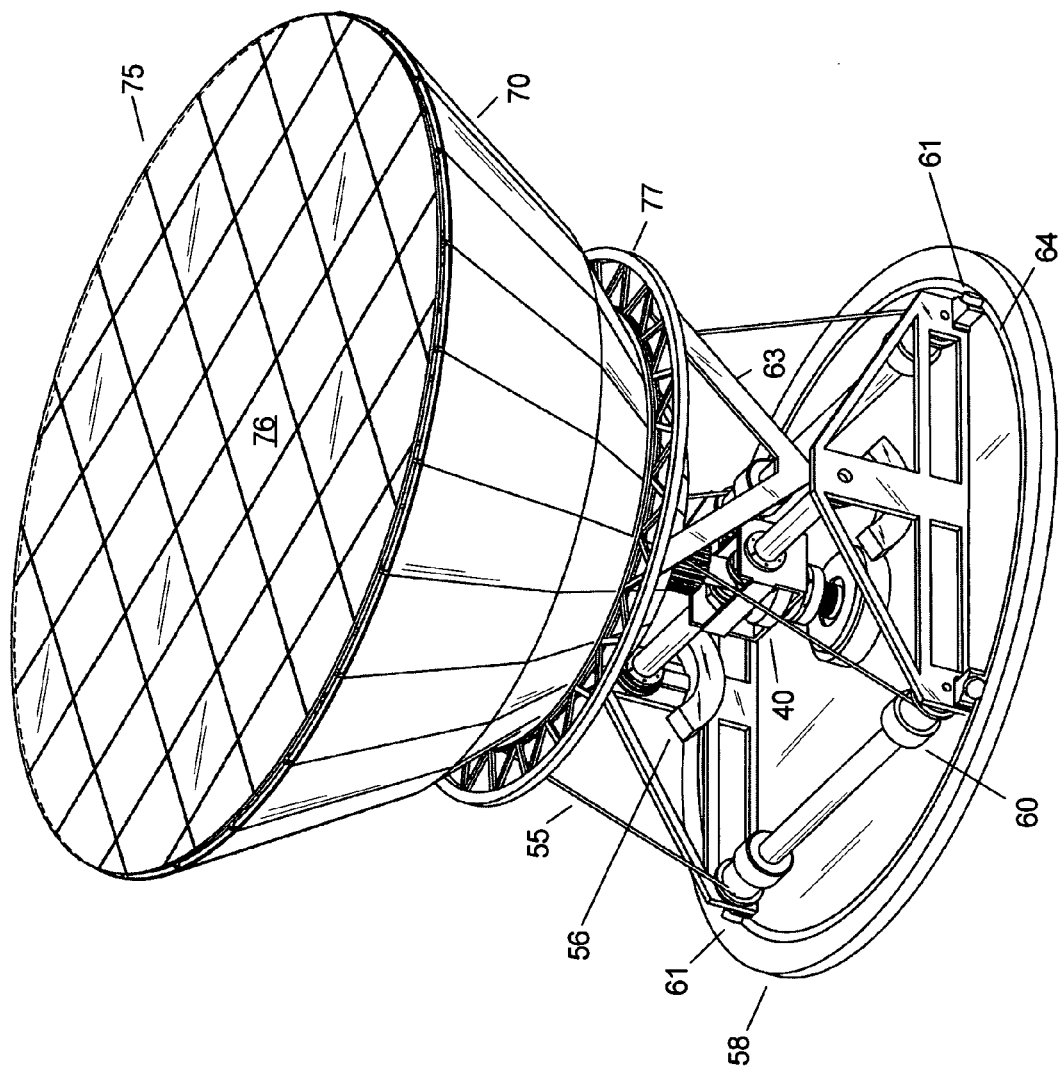
FIG. 12 is a perspective view of a solar tracking apparatus utilizing a compound conical concentrator and receiver tube of the preferred embodiments.
Figure 13:
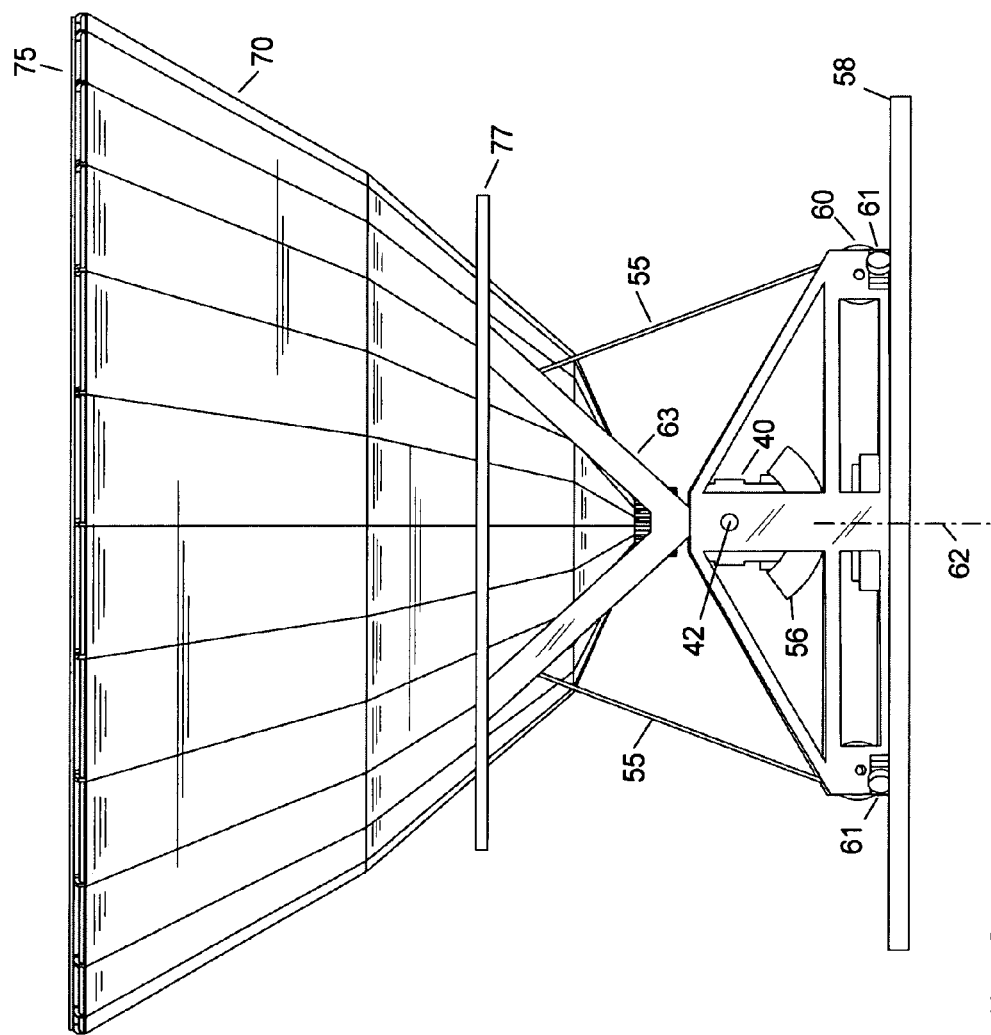
FIG. 13 is a side view of a solar tracking apparatus utilizing a compound conical concentrator and receiver tube of the preferred embodiments.
Figure 14:
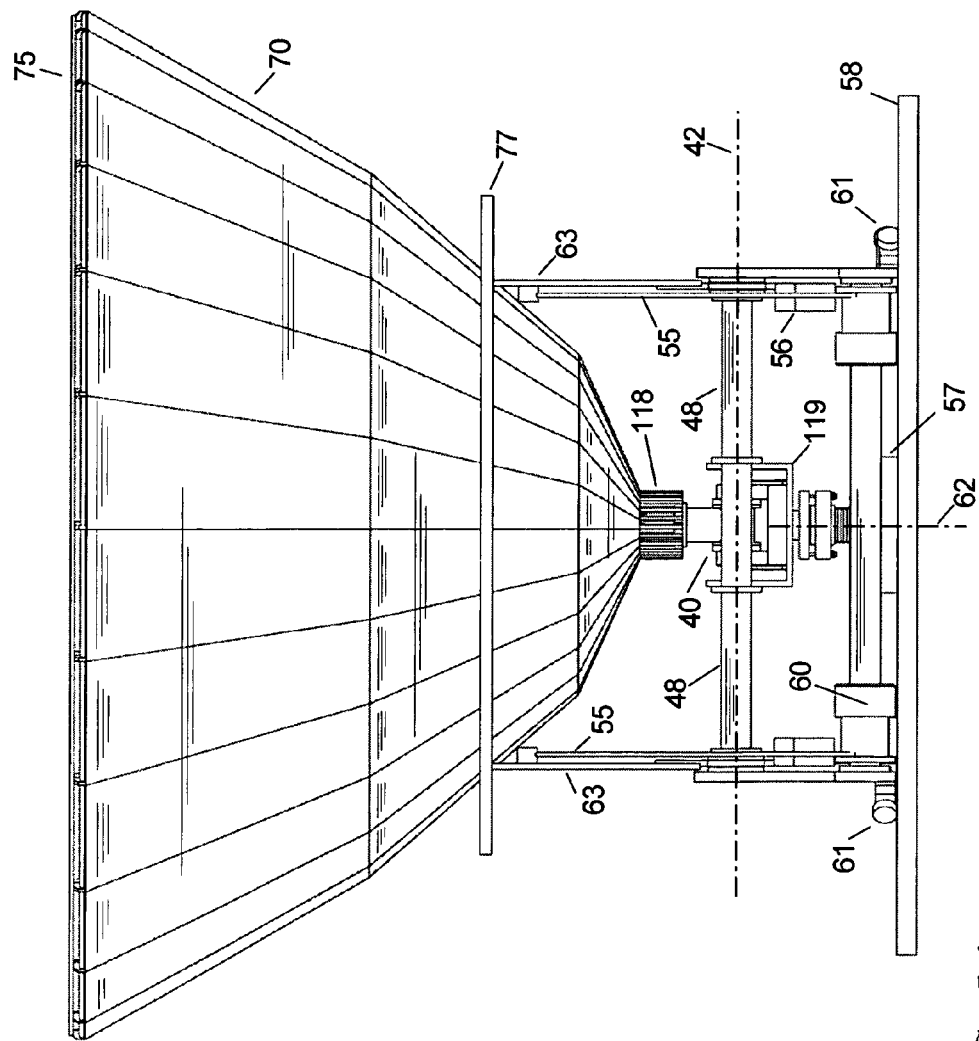
FIG. 14 is a front view of a solar tracking apparatus utilizing a compound conical concentrator and receiver tube of the embodiments.

The concentrator mount flange (38) of the mounting nipple disposed for connection to the 2-axis rotating union preferably also comprises a mount flange for attachment to the concentrator base, wherein this flange is appropriately larger in diameter so as to provide connection to the cavity base structure (118) of the CCC structure (70), in FIG. 11. Since the concentrator mount flange is preferably at elevated temperatures, relative to the concentrator structure, it is preferred that there be a conventional glass fiber gasket installed to impede heat flow between the two elements.

Joints that exist in the preferred embodiments between the insulated tubes are preferably formed as swaged fittings, wherein mating between male and female tapers results in a non-welded resistance-fit. In the case that the union between joined insulating tubes is rotating, since there is no appreciable mechanical load and very minute leakage into the annular supply passage is not problematic, such rotating unions of the HTF-submerged insulating tube can be made by a simple rotating union between machined male-female slip-joints, in FIG. 7.

Whereas it is preferred that the various non-dielectric components be fabricated from corrosion-resistant high-nickel alloys, such a Hastelloy-X, Hastelloy-N, Incolloys, Haynes 230, etc., it may be found advantageous under certain operating conditions to fabricate these parts from pyrolytic graphite instead. In cases that such a relatively brittle material is utilized, or that mechanical loads are relatively high due to weather conditions, receiver scaling, etc., it is then preferred that additional mechanical means are used to reinforce the embodied rotating tilt union. For example, it may be found advantageous to additionally implement supplemental, co-axial rotating joints that fasten to both sides of the embodied tilt union, thereby reinforcing the mechanical rigidity of the specified rotation axis, similar to an orthopedic reinforcement of a human leg, or as is commonly practiced in other areas of the mechanical arts. Such addition of commonly practiced mechanical reinforcement methods and structures, as with additional tensioned cable and strut reinforcements in the larger CCC tracking assembly (120), can be provided in conjunction with the embodied invention as is suited to a specific preferred installation or application.

As is typical with rotating unions and flow pumps of the prior art that are employed for the purpose of manipulating a high-temperature molten salt, additional enclosures for capturing and re-using any leaked molten salt may be implemented in conjunction with the embodied rotating union. Such additional structures as drip pans, "fling" enclosures, heat shields, and additional insulating structures for minimizing thermal losses, may be readily specified by one skilled in the art, and utilized in conjunction with the preferred embodiments, but are not shown herein for the purpose of clearly pointing out the preferred embodiments.

A rotating nipple (51) preferably provides a bottom bushing flange that provides a rotating planarized surface (54) for mating to a bushing plate (47) that is housed in the pivot union's static housing plate (52). Preferably, the entire hot-finger/rotating-union assembly is encompassed by an IR-reflective shield during actual operation.

Beneath the rotating tilt union of the two-axis rotating union is a rotating pivot union (50) that provides means for rotation of the single-ended receiver tube assembly about the pivot axis (62), thereby allowing the hot-finger and rotating tilt union (41) to pivot with the CCC structure while simultaneously the HTF fluid is transferred between the rotating single-ended receiver tube assembly and the static work load connected through the pedestal at work-load connector (115).

The lower pivot union (50) incorporates the rotating nipple (51) that is coaxial to the pivot axis (62) and is attached to bottom surface of the tilt union fork by means of an integral sealing flange (46). As similarly embodied in the tilt union assembly, the manifolding of the rotating pivot union provides a central lower insulated tube (145) and an annular HTF supply passage (22) peripheral and surrounding this lower insulated tube. The high temperature rotating unions of the present invention differ from such prior art rotating unions in that preferably no organic materials are used in sealing, and leak-tight seals are obtained instead by the mating of optically figured planarized surfaces so as to form very parallel and precise interfaces (54) terminated with high-temperature tribological coatings similar to the bushing plates of the tilt union.

Figure 8:
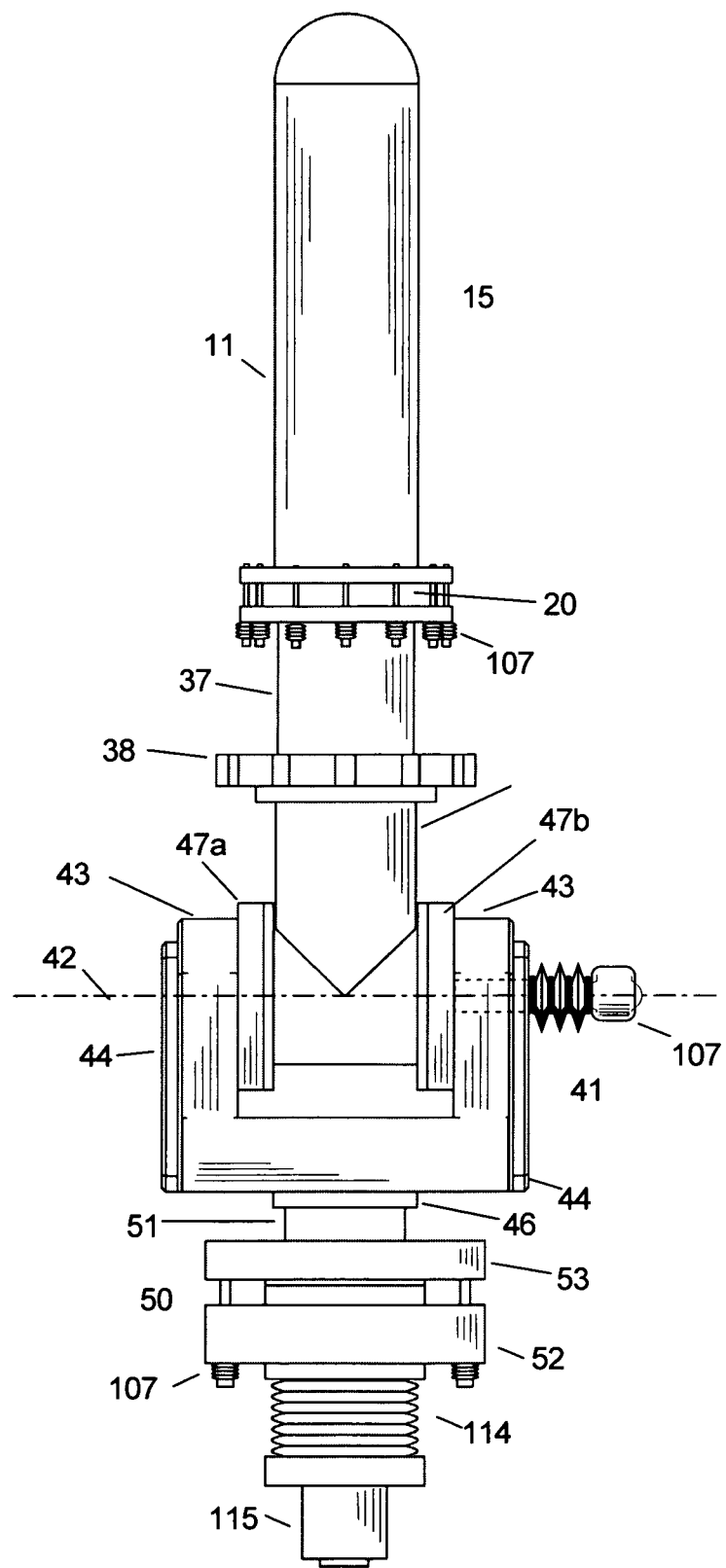
FIG. 8 is a side view of a single-ended, tubulated solar receiver in an alternative preferred embodiment.

In an alternative embodiment, inorganic seals comprising polished/planarized surfaces of the embodied tilt union assemble are provided by an alternative mechanical loading in the direction of the tilt axis, wherein compliant tensioning means preferably comprising high-temperature Belleville washers are utilized to provide a slight compressive force along the tilt axis. In this latter embodiment, in FIG. 8, HTF pathways and insulated 'C' insert are eliminated on one side (right side in FIG. 8), and replaced with a threaded hole and spring-loading assembly, which may comprise simply a large bolt and Belleville washers (107), so that there is provided means for tuning a compressive force directed axially along the tilt axis by the degree of compressive force implemented, so that sealing may be provided in an alternative to the degree of precision fabrication embodied in the preferred embodiments, in FIG. 7. The latter alternative embodiments, in FIG. 8, may be found preferable in certain circumstances where costs are critical and the increased frictional drag are acceptable, or where the HTF is a lower-temperature HTF (e.g. 400-600C range) so that very low-friction surfaces (e.g., boron nitride) are readily implemented. Compliant tensioning means are tensioned for loading the embodied precision bushing seal with compliant tensioning means (107), which comprise Inconel Belleville washers (provided in the USA by several vendors) in the present preferred embodiments.

In a further preferred embodiment, the embodied single-ended receiver tube and rotating union assembly are utilized in conjunction with a solar concentrator that is termed herein as a compound conical concentrator (CCC). The CCC's of the present invention comprises compound conical concentrator (70) having central optical axis (73) providing an inwardly facing reflective surface (110), and comprise essentially coaxial stacks of conic sections, and more particularly conic frustums, wherein each conic section is provided with a distinct sectional side-wall slope that is chosen so as to concentrate sunlight from each conic frustum of the CCC into the same, relatively short, linear absorbing volume located along the optical axis of the CCC.

In its preferred embodiments, the present invention utilizes a non-imaging compound solar concentrator formed concentric to its optical axis, the concentrator comprising multiple conical frustum structures disposed to reflectively irradiate the centrally disposed hot-finger assembly.

The embodied CCC structure may be realized in a wide variety of concentrators that embody its primary structural elements, though it is found in the present invention that certain preferred features and manufacturing methods are preferred for low-cost manufacture and efficient energy conversion. The CCC height H as defined by the total height of reflective area of the main conical sections, wherein the conical sections may be a complete circle as in the preferred embodiments, or a rotationally symmetric array of reflective surfaces sharing substantially the same conical surface of revolution.

The length h of the receiver tube assembly from its top to the tilt axis (42) is preferably provided such that the clearance distance between CCC base plane (59) and tilt axis (42) is greater than 20 cm, and more preferably greater than 50 cm. The distance between platform and tilt axis may be provided with any reasonable dimension providing the needed clearance between CCC structure and platform. Alternatively, clearance for the CCC structure at low altitude (morning and late afternoon) tilt settings be provided in part by placement of the platform on an elevated structure, such as a structure housing the intended work load.

Accordingly, a CCC of the present invention comprises at least three conical reflector sections (80) comprising a conical frustum. In the preferred embodiments, it may thus be readily understood that each conical section, or frustum, will concentrate direct solar radiation into an identical volume comprising the embodied receiver tube. Accordingly, a region of upper foci (81) determined by optical rays propagating from an uppermost reflective region of each reflecting frustum is located near the top portion, preferably closed end, of the absorbing receiver tube. Conversely, a region of lower foci (82) resulting from optical rays propagating from bottom reflective region of each reflecting frustum, will reside in a bottom portion of the receiver tube. Herein, "bottom" of the conical sections refers to the smaller end of the conical frustum that is closest to the tilt axis.

Figure 10:
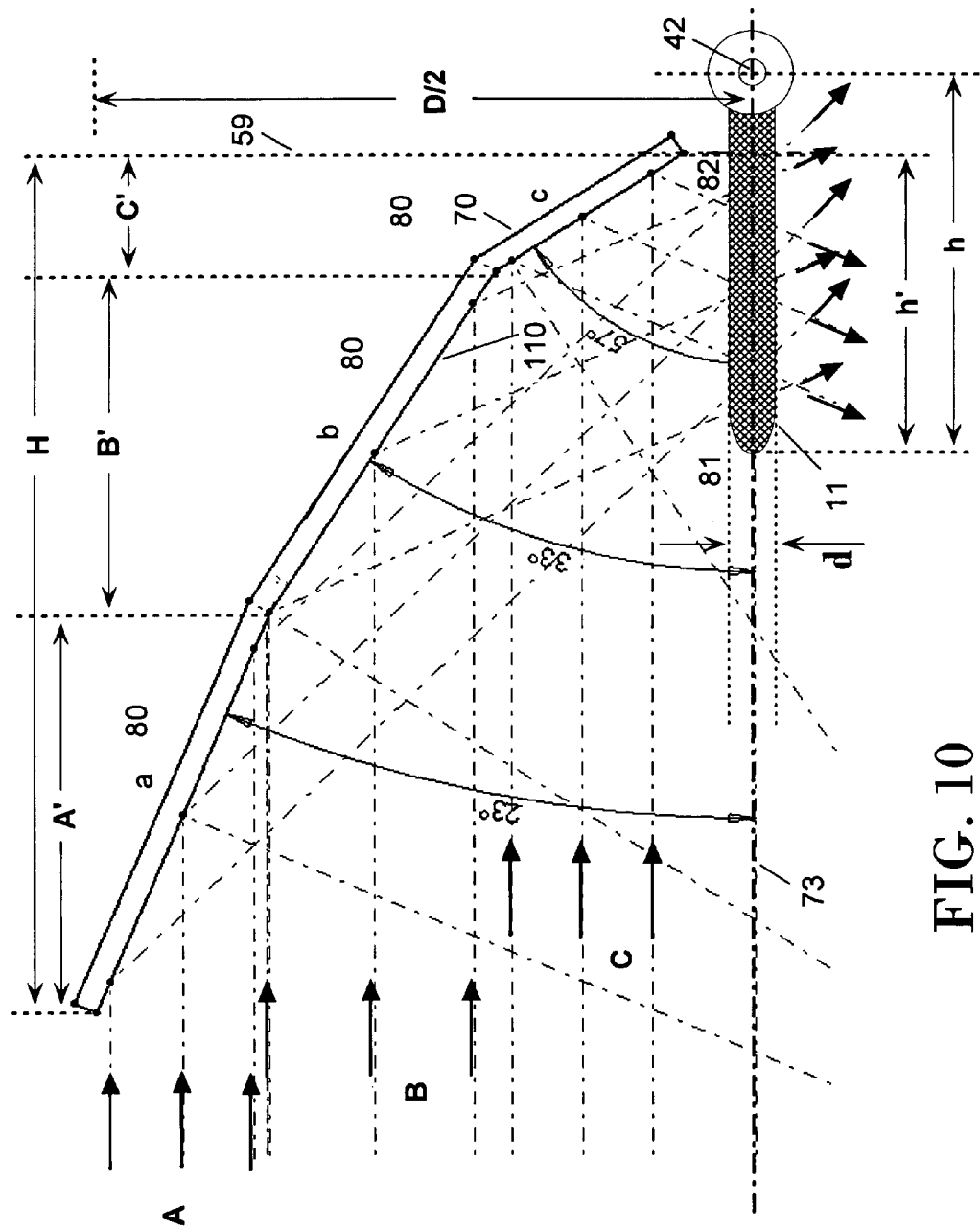
FIG. 10 is a diagram of a single-ended, tubulated solar receiver of the preferred embodiments, integrated with a compound conical concentrator of the preferred embodiments, comprising a N=3 concentrator.

The absorber length h' of the receiver tube comprises the embodied receiver tube's effective absorber length disposed so as to provide substantial heating of the HTF, and is preferably provided so as to efficiently absorb the reflected, preferably direct, solar rays propagating from each conical frustum of the embodied CCC, in FIGS. 9-10. Accordingly, the absorber length is preferably provided such that it is roughly equivalent or slightly longer than the envelope of parallel rays resulting from the paraxial rays reflected by each frustum, as depicted. In its first preferred embodiment, the absorber length h' of the receiver tube is preferably such that $0.01D < h' < 0.3D$, and more preferably, $0.05D < h' < 0.18D$. A non-transparent region (69) of the receiver can comprise the mounting nipple of the hot-finger assembly, but preferably, in the case of high-temperature operation, is a coating or cover over the glass receiver tube.

It is pointed out that the relative diameter of the single-ended receiver tube, relative to h' and D, in FIGS. 6-11, is depicted as larger in diameter than is typically preferred for purposes of clear representation. In the preferred embodiments, the diameter, d, of the hot-finger receiver tube (11), which is the fused silica tube containing and contacting the HTF, is preferably such that $0.001D < d < 0.02D$, and more preferably $0.004D \le d \le 0.015D$, wherein D is the diameter (or diagonal dimension in square embodiments) of the CCC reflector, or, equivalently, the larger diameter of the largest conical frustum's reflecting surface.

An axis of normal incidence (74) resides in a plane containing the optical axis and the propagating solar rays, and is perpendicular to the optical axis, thereby designating the axis of normal incidence with respect to the substantially linear portion (as opposed to hemispherical portion) of the embodied receiver tube's surface, for the propagating solar rays that enter the receiver tube in the plane. For example, in FIG. 9, an axis of normal incidence (74) is contained in the CCC base plane (59). It is preferred that the conical frustums be constructed so that at least 90% of the solar radiation incident on the linear portion of the receiver tube is at an angle $\Theta_i$ of propagation, relative to normal incidence, preferably such that $0° \le \Theta_i \le 60°$. Preferably this is accomplished within the constraint that the radius of the CCC's central opening is such that this radius $r_c$ is less than 1 meter and greater than 2d, though this is not a required limitation.

In FIG. 9, the conical frustums represented by the profiles A-F each correspond to a separate, stackable conical section with the distinct slope of the respective profile. In the preferred embodiments, the separate sections are stacked to form the embodied compound conical concentrator (CCC). Accordingly, an embodied CCC structure having profiles A-F may have, for example, the bottom-most section, F, removed or not employed, so that concentrated solar is received instead from conical frustums corresponding to A-E. In the same manner, a CCC constructed for a specific receiver absorbing height, h', may have additional frustums stacked and attached to the top frustum, A, so as to provide the CCC with an effectively greater receiving area, and hence, in the preferred embodiments, a higher effective concentration factor. It is preferred in the present embodiments, in FIG. 9, that at least the uppermost frustum be appropriately extended to additionally provide irradiation of the hemispherical top (16) of the embodied receiver tube assembly. In this embodiment it is accomplished that the As concentration factors of the embodied CCC's are easily obtained in the region of several hundred suns, it is preferred that a protective cylindrical shroud or sleeve (68) be transferred over the receiver tube during start-up and cool-down procedures, so as to absorb and deflect solar radiation from entering the transparent receiver tube preferably until tracking position is obtained.

In the preferred embodiments, there is a minimum clearance between the central axis (9) of the hot-finger assembly and the CCC reflecting surface, so that a central clearance opening (67) in the CCC with internal radius $r_c$ is provided. Additionally, it is preferred that this cavity is extended by an integral CCC-base cavity structure (118), preferably provided concentric to and opening to the central cavity formed at the base of the CCC.

The clearance cavity of the cavity structure is preferably provided so as to allow adequate clearance for both the single-ended receiver tube assembly and a retractable absorbing sleeve (68) that is preferably moved over the single-ended receiver tube during power-up and aligning the tracking mechanisms. Such protective shield is preferably telescoping in the preferred embodiments, but may alternatively be retracted to a position above the hot-finger assembly and within the cavity formed by the CCC structure, so that the protective sleeve (68) is in any case retracted to a position substantially removed to a position that will not block desired irradiation of the hot-finger assembly. The protective sleeve will preferably also incorporate a multitude of temperature and/or optical sensors for determining operating conditions near the sleeve surface prior to and after retraction of the protective retractable sleeve (68).

In addition, it is preferred that a top-hat heat shield (121) in the form of a circular concave IR mirror reside directly over the sealed end of the receiver tube, the heat shield reflecting emitted IR from the top—and preferably hottest portion—hemispherical end of the tube. The heat shield is preferably of a diameter slightly smaller than that which would result in occlusion of propagating rays from the upper most portion of the top frustum. In addition, a similar disk-shaped reflecting region comprising a metal reflecting film is deposited on a top disk-shaped portion of the hemispherical portion (16) of the tube, which is similarly limited in size to avoid occlusion of the uppermost locus of incoming rays.

In an alternative preferred embodiment, it may be desired that the irradiation of the receiver tube not be uniform, but that a particular gradient be realized in the solar flux and/or HTF temperature. Concentration of solar radiation by the concentrator onto the absorbing receiver tube may be readily implemented, by slight alteration of one or more conical section slopes, so that one end of the receiver tube is irradiated with greater solar flux relative to the opposite end. For example, it may be advantageous to realized hotter temperatures or higher heating of the top end of the receiver tube, so that emissive losses are minimized by requiring less heating distance at the hotter and higher-emitting end of the transparent receiver tube.

Unless noted otherwise, direct sunlight and incoming solar radiation of the present invention shall be that direct solar propagation that propagates, as paraxial rays, roughly parallel to the optical axis of the solar concentrator, typically with a divergence of less than 0.5 degrees.

In certain cases, it may be found desirable to implement a CCC that provides a higher solar power to one end of the embodied receiver tube, wherein for example, emissive losses may be reduced by increasing effective solar concentration at the end of the HTF heating path, which is the top of the receiver tube in the present embodiments. Such a gradient in the effective solar concentration, along the length of the receiver tube, may be readily achieved through slight modification of one or more conical frustums of the present invention. The implementation of this concentration gradient may be realized, for example, through an according adjustment in the slope angle of and shortening height of the uppermost conical frustum of the embodied CCC structure, so that the top of the embodied solar receiver tube is thereby preferentially heated.

Whereas any tracking mechanism may be utilized for maintaining the concentrator with its optical axis pointed toward the sun, it is preferred that the tracker be economical in its construction so as to provide a low cost of ownership. This is provided in the present invention through the utilization of a tracking base that does not require expense pedestals, large arc elements, or massive gear assemblies. It is preferred that the base be constructed with heavy use of steel cabling. In particular, the embodied CCC/hot-finger tracking assembly (120) provides tilt and pivot movement wherein tilt and pivot axes are located a preferred distance below the CCC base plane (59), such plane defined by the bottom-edge of the reflective surface (110) that is provided by the lowest and smallest-diameter conical frustum, and orthogonal to the optical axis of the CCC, in FIGS. 9-14.

The single-ended receiver tube assembly and 2-axis rotating union of the previous embodiments are preferably utilized in conjunction with a concentric tracking concentrator disposed for allowing the high degree of solar concentration that is seen as most beneficial for the preferred high temperature molten salt HTF's and for high-through-put of lower-temperature HTF's such as oil or water.

A hot-finger/CCC assembly (120) of the preferred embodiments, in FIG. 11-14, is depicted with aligned central axes (9) (73) (62) of the solar receiver tube, the CCC structure, and pivot rotation, respectively. The CCC/hot-finger tracking assembly (120), in FIG. 11, incorporates preferred embodiments of the previously described conical frustums, comprising a segment of sheet reflector material (78) that is formed into the embodied conical frustum's desired shape, in part due to the support of a conical frame of the frustum comprising conical frustum support struts (71) and reflector structural rings (72), which is preferably a round metal stock, that interlock into the support rings.

A primary concentrator support ring (77) provides main structural support of the assembled CCC structure, and is preferably composed of aluminum alloy, but is alternatively composed of steel, fiberglass, plastic, wood, or bamboo.

A 2-axis union enclosure box (119) provides mounting surface and housing for the 2-axis union, and is adjoined on either side and coaxial to the tilt axis (42) by respective steering nipples (48), which steering nipples connect the 2-axis union rigidly to the surrounding tracker base assembly, so that pivot rotation of the tracker base assembly (13) in the lateral plane will thereby steer, or rotate, the t-axis union about its pivot axis (62), so as to rotate uniformly with the base and CCC in this axis of rotation. Since the single-ended receiver tube/union assembly is preferably attached to the CCC base in a semi-rigid manner, by way of the concentrator mount flange preferably interfacing the CCC base by linear bearings that allow only very slight relative motion of the receiver tube assembly with respect to the CCC structure in the direction parallel to the optical axis, it may be preferable in certain windy installations that the steering nipples provide some compliance in their linear direction, so that any strain in the structure does not incur a stress within the rotating union assembly. In addition, it is preferred that the Mounted on steering nipples (48) opposite 'Y' struts preferably on the same rotating bearing/housing is a ballast weight (56) for providing a counterweight to the mass represented by CCC structure and attached single-ended receiver tube assembly that tilt about the tilt axis (42) opposite the ballast weight.

A pedestal (57) is provided in the tracker platform (58) that preferably provides the interconnection to the work-load, which preferably resides directly below the pedestal. In the case that the tracker base is disposed over a building that houses the work load, it is preferable that the pedestal is detachable from the base structure, so that the 2-axis joint assembly can be optionally lowered into the building for service. Connection between the pedestal/base and the HTF output connector (115) is preferably made via a high temperature alloy bellows (114) that allows for a non-rigid connection to the HTF connector. Rotating connection to the lower and rotatable insulated tube (45) is made within the lower-temperature HTF supplied into the annular supply passage (22), and so can be made with similar non-hermetic seals as rotating connections between insulated tubes in the other regions of the embodied 2-axis union.

The tracker platform (58) is a suitably flat and hard platform providing sufficient area for a base pivot track (64) that comprises the circular path of the base rotation casters (61), which are mounted at the four corners of the embodied square base structure. The mechanism for driving the pivot rotation of the base and attached CCC and single-ended receiver tube/union assembly is preferably incorporated in the caster modules, though driving the pivot rotation can be provided by any suitable drive mechanism of prior art trackers, including pivot drive means located in the central pedestal structure.

The primary CCC support ring (77) is supported on either side by "Y" struts (63) that rotate on bearing housings about the central steering nipple shaft comprising linear pipe sections of the steering nipples the 'Y' struts are disposed to rigidly support a concentrator support ring (77) that in turn provides primary support for the CCC structure. It is therefore provided that the 'Y' struts, attached support ring, and CCC structure are allowed to tilt about the tilt axis (42). The position of tilt is provided by cables (55) attached to the 'Y' struts, which cables (55) are opposingly tensioned and spooled in or out by spooling of the stepper motor/winch assembly (60), determine the tilt position of the CCC structure and attached single-ended receiver tube assembly. The assembly of 'Y' struts and steering nipples is in turn supported on a square frame that houses the winch/stepper units, and rotates on the platform by virtue of driven caster wheels (61).

A planar cover window (75) is preferably provided to separate the environment within the CCC from the external environment. This cover window is preferably comprised of a plurality of cover window segments (76). In the preferred embodiments wherein a planar cover window is implemented, such window will typically comprise a plurality of identical square segments, so that anomalous breakage costs are minimized, and large concentrator apertures may be readily accommodated by a larger grid of such windows. The planar window assembly is preferably supported by the vertical support elements of the concentrator, with a hermetic seal preferably provided between the planar window assembly and concentrator, so as to more effectively exclude contamination of the concentrator interior by rain, dust, and other unwanted media, as well as to minimize convective losses from the interior of the CCC structure. The cover widow segments are preferably uniformly coated with antireflection (AR) coatings on both surfaces, such AR coatings preferably centered in visible wavelengths and provided for maximizing transmission in the region of 350 nm to 2000 nm wavelengths at normal incidence. It is also preferred that the window segments be coated with IR reflective—"hot mirror"—coatings that maximize reflectance of IR wavelengths preferably in the range of 2500 nm to 10,000 nm, in particular for at or near normal incidence, so that IR emitted by the receiver tube surface is effectively contained within the CCC volume by the cover window. In this manner, the cover window serves to substantially decrease convective and emissive losses that might otherwise occur as parasitic losses from the receiver tube assembly. Since the CCC structure can become a secondary barrier to convective losses in the preferred embodiments, it is optional to advantageously provide insulating material on the exterior of the CCC structure.

The degree of rigidity required for a particular CCC will be determined by the environmental conditions for which the CCC and tracking base are intended. Implementation of additional rigidity-increasing structural elements such as spaceframe, strut systems, and tensioned cables can be implemented by those skilled in the art of mechanical engineering and structural design, and are well-understood, such rigidity-increasing structural elements can thus be implemented in accordance with the known art of structural engineering.

Figure 16A:
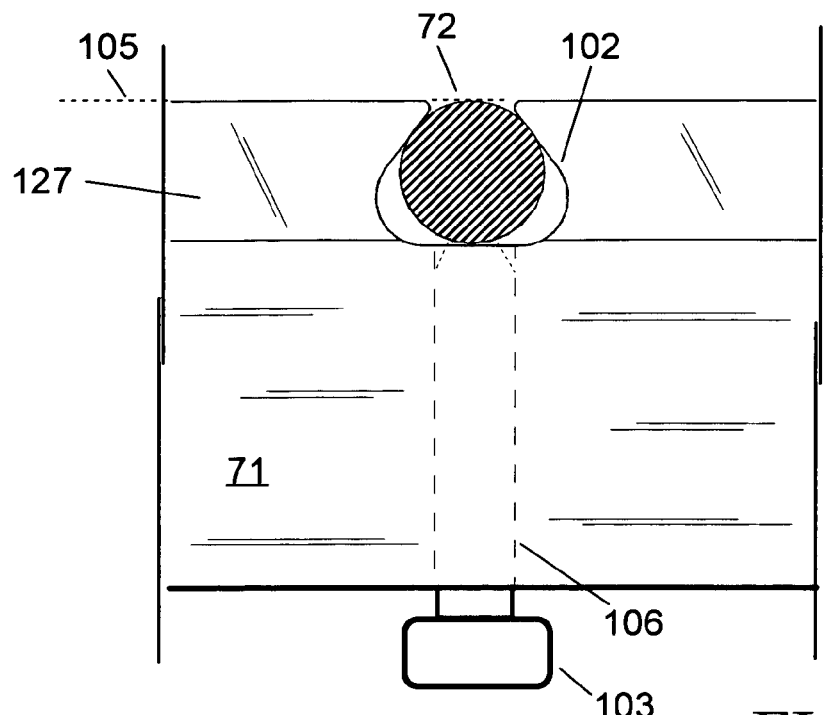
Figure 16B:
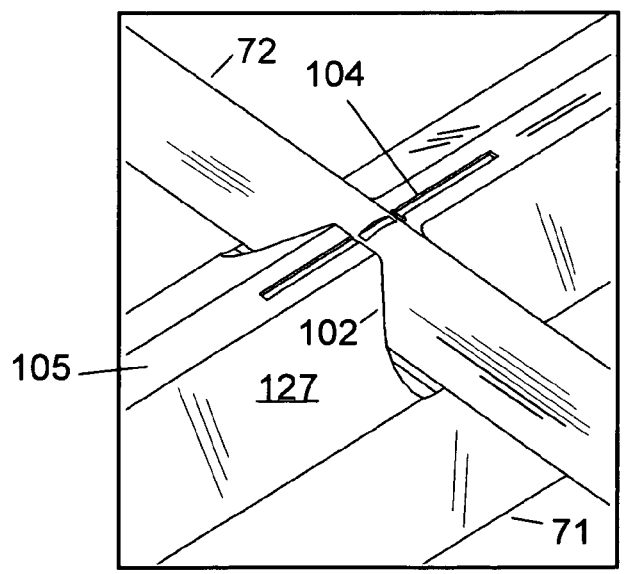
Figure 17:
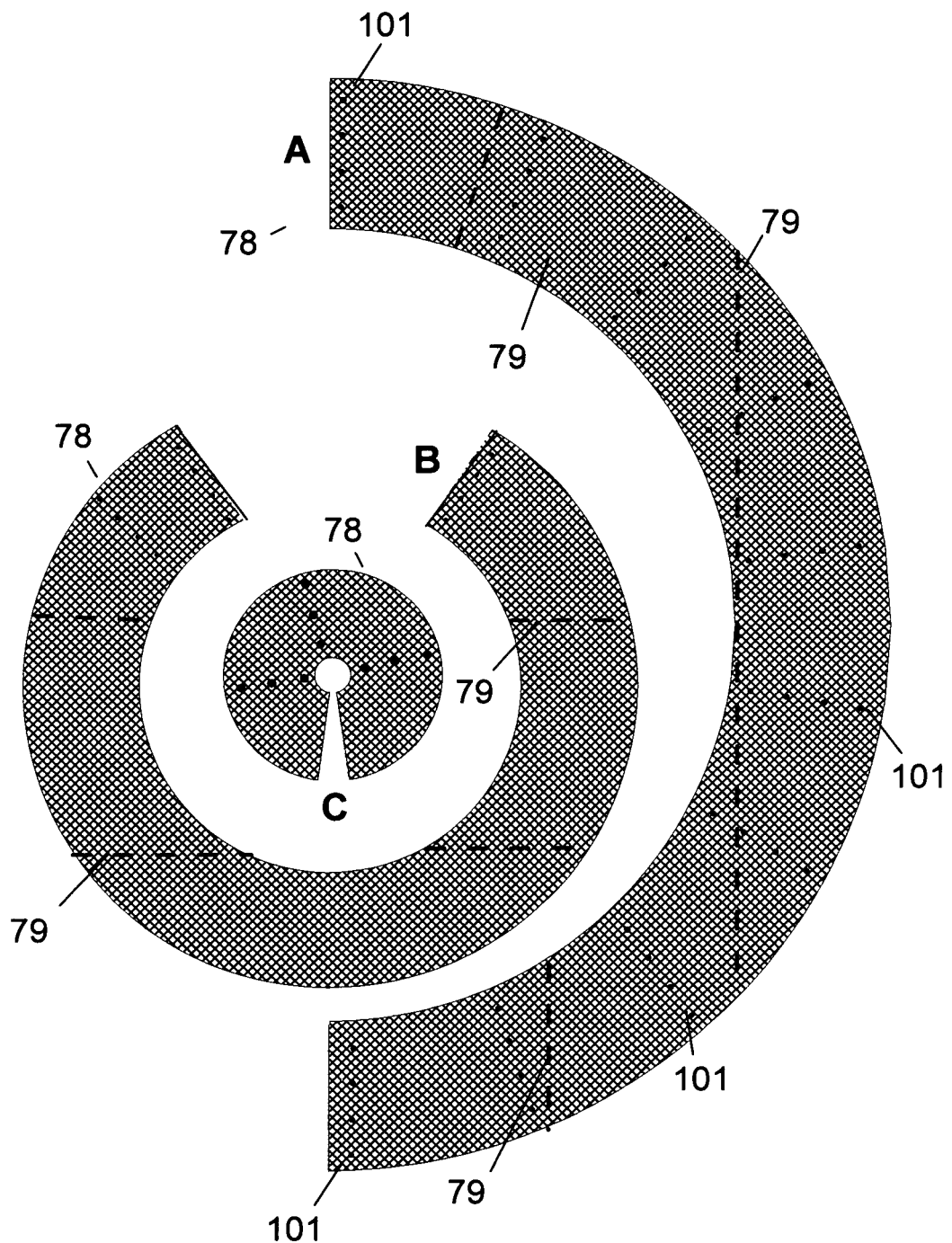
FIG. 17 is a top view of flat reflective sheet segments for a CCC of the preferred embodiments.

The embodied conical sections comprising conical frustum structures (80) are preferably constructed as stackable sections for ease of assembly and maintenance. A construction system for such conical sections is accordingly utilized for economically fabricating the conical framing that comprises the support structure for each frustum structure. Economical construction of the embodied conical section also entails means for efficiently forming the reference surfaces and edges that define the frustum surface, and is accomplished herein through implementation of the frustum support struts (71) and frustum support rings (72) that incorporate interlocking features that include registration surfaces that uniquely define the dimensions and angles of the embodied frustum. Accordingly, support struts (71) include mitered mounting surfaces (117) at either end defining the angle of connection to frustum support struts of an adjacent conical frustum. Such mounting surfaces are readily formed to accuracy of better than 30 arc-seconds by precision machining methods, and preferably lapped to tolerances of better than +/− arc-seconds by subsequent, commonly practiced, optical fabrication methods. The degree of angular resolution and accuracy in the mitered ends will be dependent upon the N of the CCC and the commensurately limited dimension h' of the accordingly sized receiver tube. The mitered surfaces are preferably provided with both fastener holes and guide pins for alignment and fastening to an adjacent frustum structure of the CCC. Frustum support struts also incorporate interlocking features comprising bottomless v-grooves (102) at intervals along the length of the embodied support strut, in FIGS. 15-16. The embodied support rings preferably comprise rod or wire steel stock, or alternatively aluminum or other appropriate construction material, preferably having a round cross-section, though polygonal cross-sections may be alternatively employed, in this way, the round stock of the support ring is of commensurate diameter so as to provide alignment of the ring to the alignment surface (105) of the support strut, by virtue of being clamped, by locking bolt (103) and threaded through-hole (106), against the inside v-groove surfaces of the embodied bottomless v-groove surfaces, in FIG. 16(*a-b*), so that both support ring and support strut are uniformly aligned to provide registration surfaces aligned to the optical alignment surface (105). The optical alignment edge of the struts is preferably incorporated into the strut as a flat surface disposed at and truncating the taper profile of a tapered linear edge (127) of the support strut. The optical alignment surface (105) or edge accordingly represents the contact surfaces against which the reflector material of the frustum is fastened. To provide efficient means of ensuring the proper spacing of struts along the support ring, it is preferred that the support ring stock incorporate registration line features (104) along its length, which features can be formed by such means as broaching or machining, and are disposed for alignment to similar registration line features formed over the v-grooves of the support struts on its optical alignment surfaces. Accordingly, the alignment of the tapered edge of the strut comprising an optical alignment surface (105) with the preferred round aspect of the support ring material in the embodied V-groove, results in a roughly perpendicular pattern of struts and rings around the circular structure of the frustum structure, which comprises a corresponding network of alignment surfaces that comprise a substantially singular surface of revolution, the surface of revolution corresponding to the desired conical frustum surface, minus the thickness of the reflector material. In accordance with a further embodiment, the subsequent fastening of the reflector material, which comprises a rolled metal reflector material of thickness preferably between 0.2 and 0.8 millimeters thick, at a large multitude of regular and predetermined spatial intervals onto the support structure including rings and struts, results in a singularly determined frustum surface that is additionally strengthened by the reflector material.

Rings are formed into circles by this interlocking approach at predetermined registration marks, with the ends of the round ring stock joined to complete the circle through use of splice connector (116) that is preferably pre-formed to provide similar v-grooves and optical alignment surface, in FIG. 11.

While the previously embodied construction system is sufficient to provide sufficient accuracy in the alignment edges for the purposes of the preferred embodiments, and is embodied as a optimally economical approach for lowest cost of ownership, construction systems of higher inherent precision and accuracy may be found advantageous for higher-concentrating CCC's, such as in the case that N>10, or receiver diameter is minimized. For example, the stackable frustums may be constructed in accordance with other construction means; for example, stamped or otherwise preformed metal sheet stock may be formed with the required radius, so as to form the embodied support rings from a multitude of preformed segments with the required circular radius preformed as an alignment surface, and mitered end-surfaces to allow joining these ring segments into a support ring (72) that interlocks at predetermined angles into the support struts. Alternatively, any of the appropriate methods and construction systems utilized for making parabolic dishes and similar structures of the prior art may be applied to construction of the preferred stackable frustum sections.

In the first preferred embodiments, the support elements of the embodied frustum structure preferably comprise an internal frame for supporting an externally applied reflective material. However, either an external frustum frame or an internal frustum frame can be preferred depending on the precise application and the type of reflector material utilized. In either case, the embodied construction system is as easily configured for external or internal frame designs, simply by appropriately incorporating the described features of the support struts. Externally supported conical frustums incorporating a support strut, in FIG. 15(*a*), for external frames and internal reflective material as well as internally supported conical frustums incorporating a support strut, in FIG. 15(*b*), for internal support frames and externally applied reflector material, are both provided via the same design approach in the embodied frustum construction system.

The conical frustums of the preferred embodiments preferably comprise individual frames to which a rolled reflector material is applied. In its first preferred embodiment, the frame is an interior skeleton, with reflector material wrapped around the exterior of the frame. In an alternative preferred embodiment, the conical frames of the present invention are external frames as is more commonly utilized for parabolic dishes. In either case, a construction system is embodied providing for precise formation of the desired reference and registration surfaces and edges for controlling the shape of the applied reflector material, so as to conform with high fidelity to the desired conical frustum.

There are preferably multiple structural support rings (72) incorporated in the conic frame supporting each conic frustum. The number of such rings can vary widely, depending on the wind conditions and concentrator diameter, and thickness of the ring stock used, but is preferably between 2-100, and more preferably, between 3-20 per conic frustum. In an alternative embodiment, the embodied conical frustum frame may comprise instead a multitude of windings forming a helical spiral of preferably high-modulus wire (e.g. plano wire) that interlocks into the embodied V-groove features. Alternatively, tensioned linear pieces, thereby providing a reflector support ring of the preferred embodiments, may be provided in the form of a high-modulus steel rod, such as by utilizing high gage plano wire.

In the preferred embodiments, the CCC is provided its reflective surfaces by means of a roll-processed reflective sheet segment (78), which may comprise any suitable reflective sheet, preferably a rolled metal strip that is subsequently polished and coated with a reflection-enhancing material. Alternatively the reflective sheet material may comprise a polished metal strip of a metal such as aluminum, ferrous, or Ni-base alloys; in a further alternative embodiment, the reflector material is a rolled polymeric material, such as a PET, PVC, or polyimide, that is web-coated to provide desirably high solar reflectance.

Each conical frustum is constructed utilizing the preferred reflective metallic strip material, preferably comprising a rolled metal strip of relatively thin gage, preferably less than 2.0 millimeters thick, and more preferably between 0.2 and 0.8 millimeters thick, though other thicknesses outside this range may be readily utilized. The reflective sheet segment is preferably composed of joined subsections that are welded, or otherwise joined along linear seams (79) that allow for the entire reflective sheet segment to be constructed into a single monolithic sheet segment. The reflective sheet segments are then preferably provided with fastening holes (101) that enable fastening the sheet segment to its respective conical frame the fastening holes are further operational in providing registration of the sheet segment with the conical frame at a plurality of points, so that the reflective sheet segment (78) becomes a tensioning element in the resulting conical frustum, thereby enabling it to retain its desired shape while frustrating undesired flexure of distortion.

A primary advantage of the concentrator design herein is in its ability to allow precision optical resolution and concentration factors equivalent to parabolic dish systems, without the expenses associated with making actual aspherical surfaces. The parabolic and other aspheric concentrators of the prior art that require quadratically derived surfaces, or surfaces that possess curvatures in more than one axis, typically require both proprietary molding/shaping processes for producing panels that possess these aspheric properties. Instead, the present embodiments realize the concentration capabilities of a tracking parabolic dish, but through use of flat reflector sheet utilized for less concentration trough systems. Rather than incorporating the relatively expensive forming of quadratic surfaces that is required in prior art trough systems and tracking parabolic dishes, the present embodiments provide high concentration by use of linear structural elements—such as extruded aluminum framing, rebar, I-beams, and channel stock—that can be obtained readily obtained as standard inventory from conventional mills. Alternatively, such linear stock can as readily comprise materials such as plastics, ceramics, glasses, or any other material that is produced for structural, load-bearing purposes.

In the first preferred embodiments of the present invention, concentration factors of 200-1000 suns are preferred for allowing relatively loose tolerances in the construction and low cost in the materials utilized in the embodied CCC. In this way, it is envisioned that economical realization of solar-thermal, concentrated photovoltaic, and combinations of both can be realized with relatively inexpensive cost-of-ownership. Accordingly, the CCC of the first embodiments is constructed largely of linear metal stock that is readily available and is typically the least costly embodiment of a particular commercial metal alloy. In accordance with the first embodiments, low-cost is also achieved by use of tensioned steel cables, rather than rigid structural elements, where ever practical.

An important advantage of the present invention is its use of reflector materials that may be produced by roll-to-roll manufacturing; that is, sheet material that is manufactured in a substantially planar form that can be processed and stored using rolls of sheet material, and through use of such manufacturing processes as roller mills and web processing. In the preferred embodiments, the reflector material is fashioned into segments that are each provided a shape unique for the purpose of matching the surface area and shape of a conic frustum incorporated in the CCC structure. Accordingly, each reflective sheet segment (78), in FIG. comprising the reflector material required for one conic frustum, comprising a flat sheet that is formed prior to construction of the frustum. An important function of the pre-fabricated segments of reflector material is in providing pre-determined registration holes (101) that result in unique positioning and alignment of the reflector material when fastened by such registration holes to uniquely positioned fastener positions in the embodied support strut (71) and support rings (72). In this way, the reflector material is restrained to conform to the desired conical shape, and in addition, provides additional tensioning means for increasing rigidity of the frustum structure. With the placement of holes for fasteners in the reflector sheet, all dimensions and angle of the conical structure are uniquely determined, as the reflector sheet adds an additional tensioning structure.

The flattened reflector material segments are typically larger in dimension than available rolled reflector material and are preferably constructed by joining linear pieces of rolled reflector material, preferably by spot-welding or otherwise providing a fused linear seam (79). In the case that the reflector material is exceedingly thin, such as in the case that it is a coated PET (e.g., Mylar) film or other polymeric sheet material, an internal skeleton may be implemented for wrapping and tensioning such flexible material around the outer diameter of such internal skeleton, which may be readily implemented using the v-groove features of the invention formed in the outer-facing edge of the support rings, in FIG. 15(*b*), with structural rings accordingly disposed in these v-grooves to provide outer-facing conical frame-work of optic alignment surfaces (105) that substantially conform to a single conic surface of revolution, so that a reflector material wrapped about this latter conic frame will rest against the alignment surfaces of the respective struts and rings to form a substantially singular conic surface of uniform slope. Accordingly, the alignment surfaces (105) of the present invention may be an outward-facing framework of alignment surfaces for externally wrapped reflector material so that the embodied conic section frame is an internal frame within the CCC structure; or, alternatively, the conic framework is an internal-facing framework of alignment surfaces supporting an internally placed reflector material.

Figure 18A:
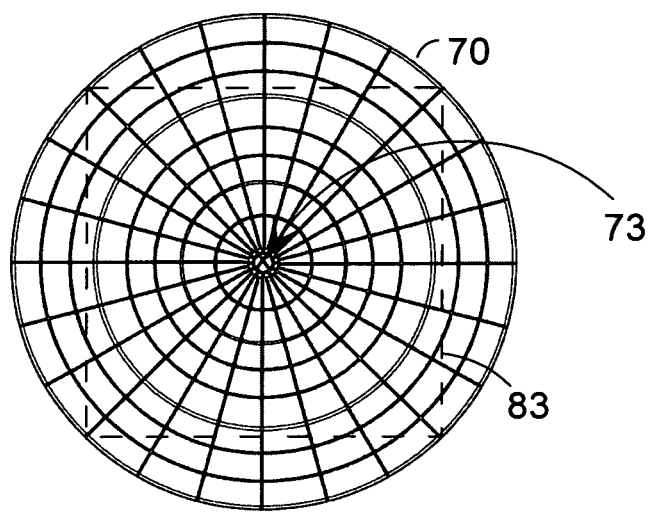
FIG. 18 (a-b) is a top view of a compound conical concentrator of the embodiments, comprising alternative embodiments of (a) a rectangular concentrator aspect and (b) a concentrator of the preferred embodiments with peripheral and central solar panels.
Figure 18B:
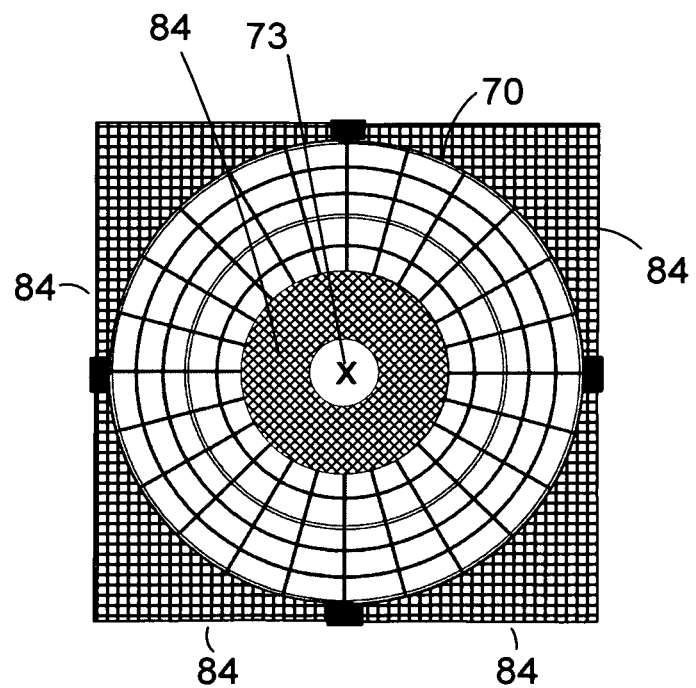
Figure 19A:
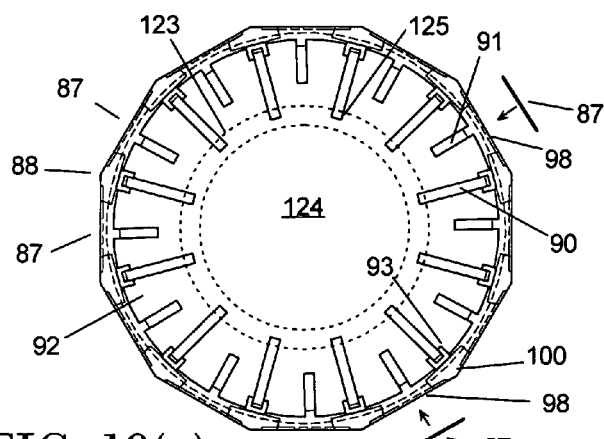
FIG. 19(a-d) is a high-power, mountable MJPV insert assembly of the preferred embodiments, comprising an (a) end-view, (b) side-view, (c) close-up perspective view of a disassembled bus digit assembly of the insert assembly, and (d) close-up perspective view of an assembled bus digit assembly of the insert assembly, in accordance with a preferred embodiment.
Figure 19B:
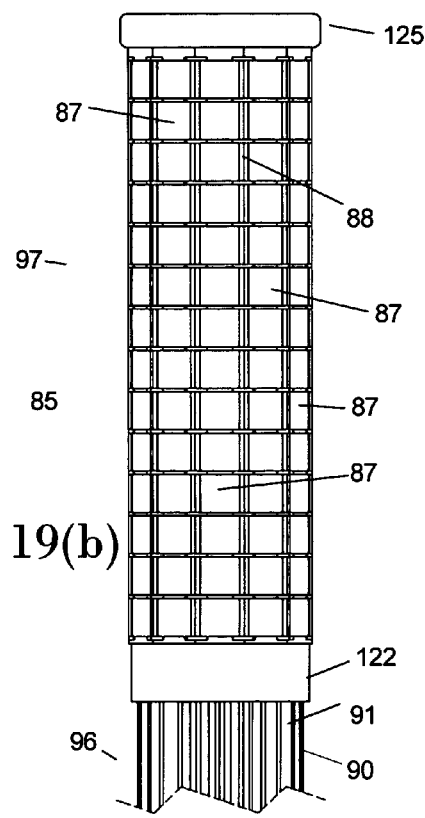
Figure 19C:
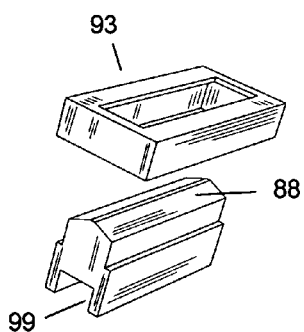
Figure 19D:
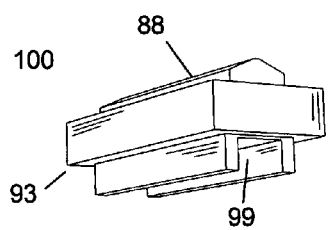

If efficient utilization of ground space and high packing density is a primary consideration, then the present embodiments can be readily modified to render CCC structures that are formed to possess a faceted top aspect, having straight sides that essentially delimit the conical frustum by vertical sectioning planes (83), preferably so that the reflector has a square aspect in the direction orthogonal to the optical axis, such as is taught with respect to similarly sectioned dish concentrators of the prior art. Alternatively, a square profile or other desired aspect may be provided by fitting appropriately shaped solar panels (84) at the periphery of the concentrator, so that the embodied CCC structure possesses a square aspect with a square perimeter, in FIG. 18(*a*). For example, a ten-meter diameter circular concentrator may be combined with solar PV panels so as to provide a 10-meter square collection area, thus further utilizing the provided tracking structure, and providing alternative electrical energy for running of the tracking motors and fluid pumps. It is also anticipated herein that, in the case that $r_c$ is quite large, such as to be on the order of a meter or larger (such as when irradiation upon the receiver tube is desired to be more limited in its deviation from normal incidence), then solar panels may also be incorporated in the CCC/hot-finger tracking assembly within the central opening, in FIG. 18(*b*).

Hence, the conical sections of the preferred embodiments are stackable and so are easily dismantled and assembled in the field. In this way, in dense packing of such CCC devices in a solar plant, clearance required for access trucks between individual concentrators can be minimized, as single frustums of an N=6 CCC, having, for example, a 10-20 meter radius can still be easily transported on their side within the clearance of a standard automobile's wheel-base, since the depth of such conical frustums will typically be on the order of 1-2 meters.

Utilizing the structural embodiments herein, the maximum concentration allowed by a particular concentrator design will be determined by the achievable perfection in the circular support rings and the degree of restriction in the diameter of the absorbing cylindrical body. For example, a divergence of 0.05 cm, or half a millimeter, in the dimensional stability of a 100 cm length of a multiply fastened reflector support ring (72), is readily achievable by standard extrusion and machine-shop practices and through use of standard aluminum alloys (e.g. 6061 Al). While much higher tolerances are readily achievable by machine-shop methods (and much greater still by optical fabrication methods), such relatively low tolerances in fabrication enable a D=10 meter, N=6, CCC that concentrates direct solar radiation to a 5 cm diameter, roughly 1 meter-long absorbing volume. Whether or not it is worthwhile providing larger or smaller diameter receiver tubes will depend upon the precise emissive properties of the utilized absorbing HTF, or, alternatively, the precise absorbing interfaces of the absorbing element being utilized, since collecting a larger solar divergence may be counter-productive if off-set by a larger emitting surface of the receiver tube.

Using relatively rigid materials, Higher-N CCC's (e.g., fifty sections), and precision machining techniques that regularly produce +/−0.001" (+/−25 micrometers) tolerances, solar furnaces and solar-pumping configurations providing concentrations of 10,000 suns can be readily envisioned utilizing the CCC approaches of the present invention. Utilizing the absorbing molten salt suspensions of the previous embodiments, so that the concentrated solar radiation is coupled directly into the volume of the molten salt of the preferred embodiments, extremely high heating rates of the molten salt are realized. In this way, minimum emissive losses are experienced, due to the relatively short residence time of a given volume of the embodied molten salt (e.g., molten nitrate salts, NaCl, KCl, FLIBE, FLINAK, etc.) within the transmitting section of the hot-finger assembly. In conjunction with the absorbing salt mixtures, 900C-plus hot-finger designs, low-cost tracking mechanisms, and CCC structures of the present invention, it is anticipated that the CCC apparatus of the present invention will be a viable replacement for nuclear power in its steam-generating capacity. A field of approximately 5,000 10-meter CCC's in accordance with the preferred embodiments is calculated to provide approximately 250 MW of steam generating heat during peak hours. Unlike heliostat-like "power towers" of the prior art, the present embodiments are also ideally suited for distributed generation for localized generation of power and/or heat (CHP) at facilities with limited space or resources for a larger installation.

In an alternative preferred embodiment, the principles and structures set forth herein are adapted for implementation in a dual purpose hot-finger assembly that incorporates both multi-junction photovoltaics (MJPV) for electric power generation as well as solar-thermal energy production.

The tubulated receiver, in FIG. 6, may be reconfigured for applications other than purely solar-thermal heating of an HTF. For example, in conjunction with previous embodiments of the present invention, there is alternatively embodied an insert assembly that can be interchanged with the inserted absorber assembly, as embodied in FIGS. 6-7. The high concentration factors and economical construction enabled by the embodied CCC structure and receiver tube format are also advantageously utilized in conjunction with multi junction photovoltaic (MJPV) arrays comprising preferably compound semiconductors, wherein the high current densities and temperature ratings of such MJPV modules are suitable for essentially identical receiver tube configurations as embodied herein, in FIGS. 19-21.

A MJPV insert assembly (85), in FIG. 19, is provided in the present embodiment and is directly integrated into the previously set forth hot-finger assembly, in place of the single absorbing tube of the earlier embodiments. The MJPV insert assembly preferably comprises a power conversion section (97) formed as an integral PV cylindrical/polygonal mount structure and heat sink (86), which is preferably a machined copper and alumina ceramic assembly. Alternatively the metal portions of the insert assembly may comprise an aluminum alloy, or other suitable metallic material.

The power conversion section (97) comprises the polygonal section of the insert assembly that provides mounting platforms for the MJPV modules (87), which provide conventional front-side (irradiated side) and back-side electrical contact pads. Appropriate modules are manufactured by Spectrolab, Emcore, and other firms, wherein a 1×1 cm square receiving area is common in individual modules.

Outer flow channels (92) are formed between the main current bus bars (90, 91) so that the main current bus bars also serve as cooling fins for efficient cooling by the HTF. Extension region (96) comprises supporting bus bars preferably comprising the main current bus bars (90, 91).

Insertable machined ceramic insulators (93) provide electrical insulation between front-side and back-side contact circuits, wherein the ceramic insulator is provided as an insulating integral sleeve for the drop-in front-side bus bar digits (88), as insulated bus digit assembly (100) in FIGS. 19(*c-d*), wherein the bus digits are fashioned with bus digit slide recess feature (99) on side opposite their MJPV-front-side contacting surfaces, such slide recess feature interlocking with outwardly facing surfaces of the front-side main bus-bars (90).

It is thus preferred that the plurality of radially positioned main bus-bars comprising main MJPV-front-side current bus-bar (90) and main MJPV-back-side current bus-bar (91) provides both support and the primary current path to the external contact rings (94, 95). In addition, the main bus bars may optionally include absorbing coatings in the preferred embodiment that the HTF is utilized as a solar-thermally heated energy source, such that the extension region (96) serves as a solar absorption section providing substantial solar heating of the returning HTF of the present embodiment. Accordingly, the embodied MJPV solar receiver tube of the present alternative embodiments may serve as a combined heat and power generation device, which device is seen as useful in distributed energy applications wherein both medium temperature (100-300C) HTF and solar-generated electricity are utilized for local energy needs.

The main current bus bars extend from the transparent receiver tube into the interior of the mounting nipple, where they are interlocked with corresponding contact plates of (positive) front-side contact ring (94) and (negative) back-side contact ring (95) that comprise essentially split collars encircling the mount nipple, such The external surfaces of the polygonal power-conversion section (97) comprise elongated facets, each elongated facet comprising a plurality of preferably square back-side contact pads (98) for contacting MJPV module (87) backside contact. Each back-side contact pad (98) of the conversion section is preferably in electrical communication and integral to an adjacent main back-side current bus bar (91) which extends most of the length of the power conversion section, and also extends beyond the power conversion section to provide contact at external contact rings integrated into the mounting nipple.

It is preferred that the MJPV tubulated receiver is adjoined to integral glass-metal seal (33) which comprises a flange that is subsequently mounted to the receiver tube mounting nipple (37). It is further preferred that the embodied MJPV insert assembly be actively cooled by an appropriate HTF that is confined to flow between central supply tube and the outer flow channels (92), so that insulated bus digit assemblies (100) are hermetically sealed in place by standard ceramic-metal sealing means, and inner transparent receiver tube is preferably sealed by organic means to cylindrical sealing surface (122) fashioned into the end of the preferably copper polygonal mount structure. The opposite end of the insert assembly is similarly sealed by end-cap (126). The entire assembly is then encapsulated in the outer tube (12), which in the present alternative embodiment, need not contain a vacuum, but instead is preferably backfilled with a gas, preferably Argon.

Alternatively, the embodied MJPV insert module may allow to be utilized in conjunction with relatively low-temperature (<300C) electrically insulating and transparent heat-transfer fluids, such as ethylene glycol or mineral oil, wherein such HTF's are allowed to circulate on both interior and over the exterior surfaces of the MJPV insert assembly (85). Such embodiments may be implemented with additional protective coatings applied to the MJPV modules.

Figure 20:
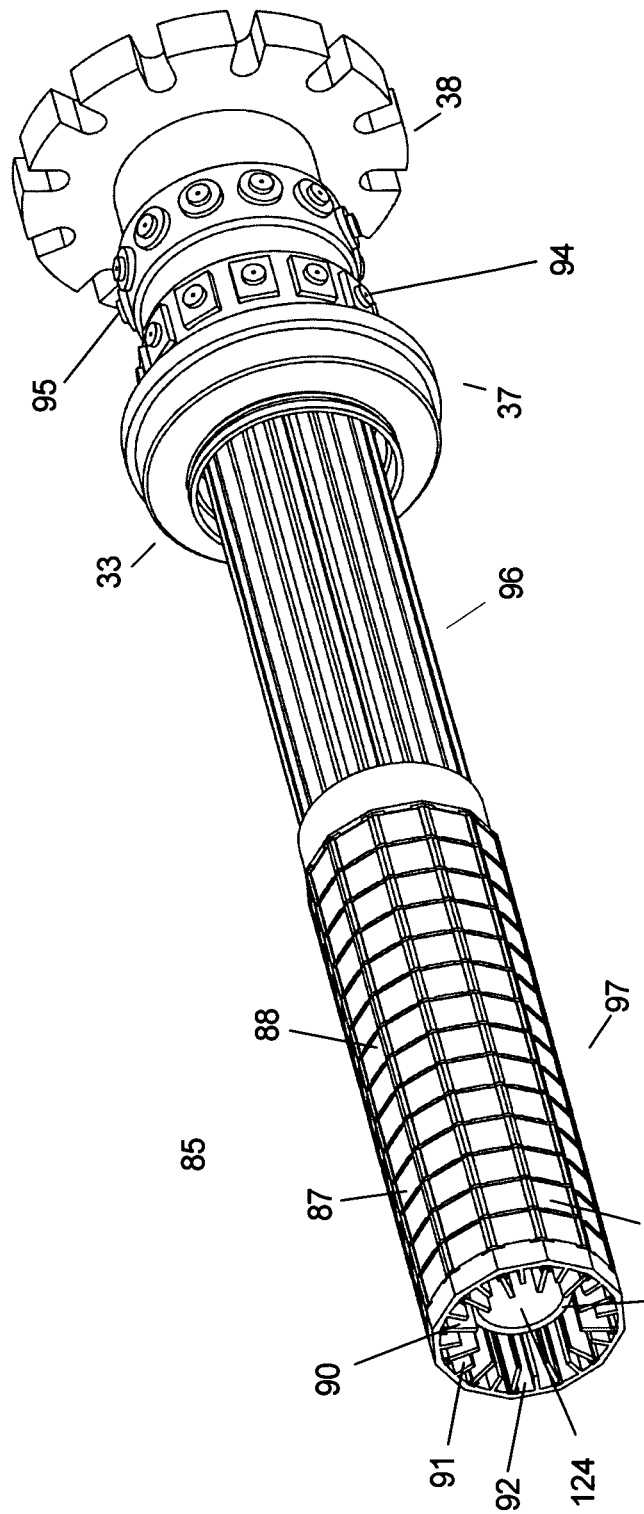
FIG. 20 is a multi-junction PV solar receiver of the preferred embodiments.
Figure 21:
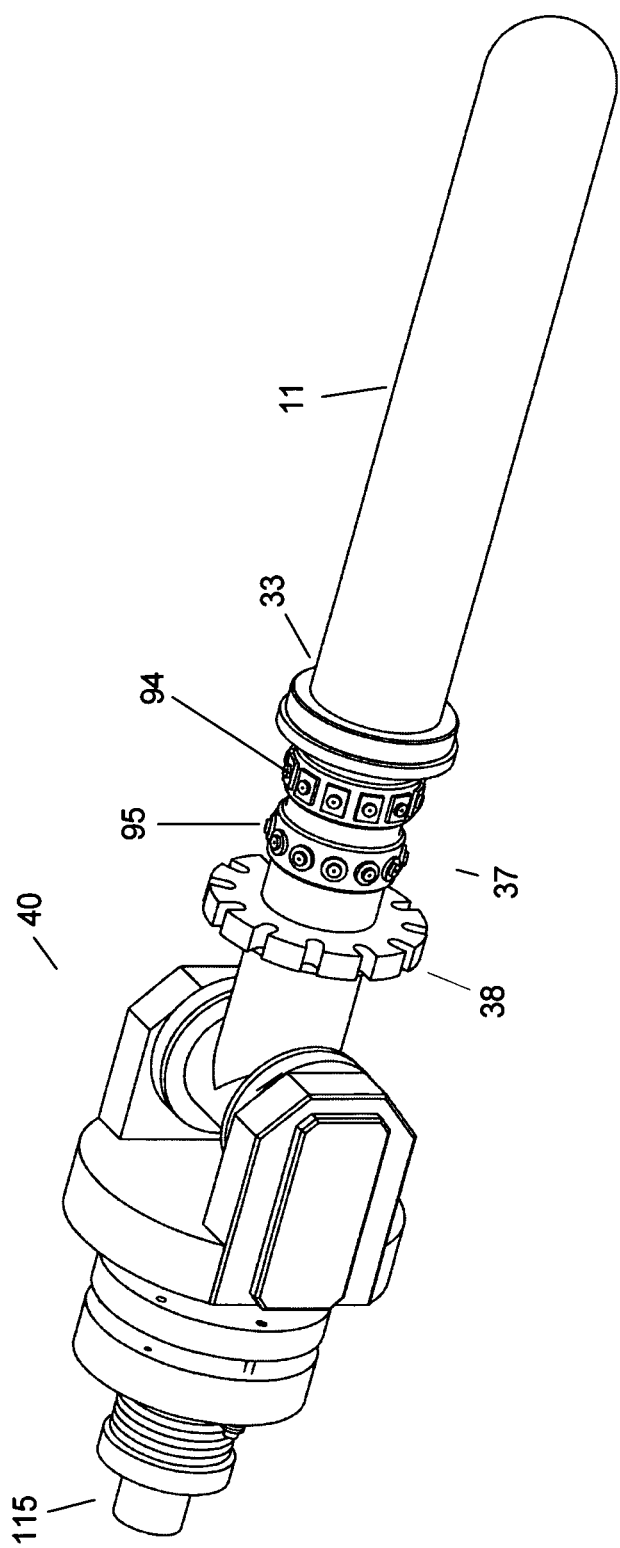
FIG. 21 is a perspective view of a single-ended and tubulated receiver tube of the preferred embodiments comprising a dual-use solar thermal receiver and multi-junction PV collector.

A dual purpose MJPV/solar-thermal receiver tube is accordingly provided, in FIG. 20, wherein the MJPV insert assembly (85) is preferably integrated with the previously embodied tubulated receiver tube of FIGS. 6-7. In the present alternative embodiments, a central tube (123) provides the HTF coolant supply passage (124) and is preferably comprised of an electrically conductive metal, preferably copper, or alternatively, and aluminum alloy. The central tube (123) is, in the present alternative embodiments, fashioned so as to provide sliding contact with the preferably parallel array of current bus bars that correspond to either positive or negative polarity of the embodied MJPV modules. In the present embodiments, it is preferred that the central tube is fashioned so as to provide sliding and conductive contact comprising sliding insert channels (125) with the MJPV-front-side main bus-bars (90) providing an electrical bus to the front-side contacts of the MJPV modules. The central tube thus provides a mechanical guide surface for maintaining position of the PV insert assembly within the transparent receiver tube. It is preferred that the central tube, thus acting as a guide rail, is machined so as to further incorporate parallel grooves in its outer surface so that the front-side main bus-bars (90) slide along the central tube with the bus-bars guided and contacted by the interior surfaces of these parallel grooves.

It is preferred that electrical interconnection between the main bus bars of the MJPV insert assembly and an external work load powered by embodied MJPV assembly be made by means of high-current electrical bulk-head contacts in the form of preferably two rings (94, 95)—or, collars—that encircle the receiver tube mounting nipple (37), wherein each provide an external electrical contact for one of either the negative or positive polarity of the embodied MJPV assembly. A multitude of high-current metal-ceramic feed-trough's are disposed in each ring in number corresponding to the number of main bus-bars being contacted, wherein contact of each feed-through to its adjacent main bus is preferably by means of sliding, clamp-able rail contacts. High-current copper strapping may then be utilized for carrying current to/from the ring contacts to the desired work-load for the application being powered. The central tube (123) thus is provided connection to the slip-fit interconnect fitting (36) of the previous embodiments so as to provide similar annular and central fluid passages for supply and return of an HTF. Accordingly, the embodied MJPV assembly may be incorporated into an alternative PV-hot-finger assembly, in FIG. 21, which may be exchanged with the previously embodied hot-finger assembly in the various CCC/hot-finger embodiments of the present invention.

Because of the high concentration factor provided by the embodiments, the present invention is ideally suited toward the processing of high-temperature fluids that are found useful in the refining and materials processing industries. For example, at molten salt temperatures exceeding 900C, production of hydrogen from becomes directly possible without further heating required. Hydrogen production may also be enabled by incorporation of the preferred embodiments for producing temperatures that allow $TiO_2$ (titanium oxide) phases to provide effective photocatalytic splitting of water for hydrogen and oxygen production.

In addition, achievement of fluid temperatures exceeding 800-900C would enable considerable energy savings in materials processes that require higher temperatures, by providing a substantial portion of the energy required toward realizing a required process temperature.

At the elevated temperatures provided, the embodied solar-thermal concentrator is also well-suited for implementation in processing of gases and vapors by solid-oxide electrolytic systems utilizing oxygen ion conductors such as yttria-stabilized zirconia, Scandia-stabilized zirconia, cerium-gadolinium oxide, and others. For example, in a solid oxide fuel cell (SOFC) system utilizing the chemical potential between hydrogen and oxygen, the generation of hydrogen is provided by the inventive solar-thermal concentrator as embodied for hydrogen production in the sulfur-iodine process, or by providing the high temperatures required for low-energy splitting of water, that have normally been sought via nuclear heating methods.

Conversely, solid-oxide electrolyzers that are implemented for such applications as coal gasification, hydrogen production, or oxygen production, can be operated with lower energy costs by utilizing the embodied solar-thermal concentrator to provide the higher temperatures, 600-1000C, at which these devices are known to efficiently operate.

The embodied hot-finger/CCC assembly is not intended to be restricted in its applications to those discussed herein, as any previous solar-thermal application of the prior art may be contemplated, including applications for roof-mounted systems for water heating or oil heating, operation of attached Stirling engines, steam turbines, thermoelectric conversion devices, etc. The fluid phases that may be utilized as the effective HTF in the present invention are similarly not limited to the preferred molten salts, as any medium configured in a fluidized form may be utilized as the HTF of the present invention, including but not limited to oil, water, molten salt, steam, gases, $CO_2$, any super-critical liquid/vapor medium, etc.

As embodied previously, the receiver tube features and methods of the present invention are also uniquely suited for the realization of efficient solar-pumped laser apparatus. For example, a high-efficiency YAG laser resonator is incorporated along the central axis (9) of the transparent receiver tube so as to comprise the absorbing element. The rear-reflecting facet of the YAG rod is preferably disposed at the top end of the receiver tube, with the emitting reflective end located in the bottom portion of the hot-finger assembly, so as to emit laser radiation along the central axis and toward the embodied tilt union. In such an alternative embodiment, the HTF may also include a laser-processed medium. Alternatively, the embodied 'T' joint may incorporate optical means for coupling the laser emission out of the tilt union assembly for useful processing of materials, laser-induced hydrogen generation, etc.

While the preferred embodiments utilizing molten salts are particularly pointed out for providing heated HTF in the region of, this is not intended to limit the range of application, since many of the novel embodiments may be advantageously utilized outside of this temperature range.

In addition, the solar-thermal receiver and MJPV hybrid receiver of the preferred embodiments is not intended to be limited to 2-axis tracking assemblies of the preferred embodiments, as the inventive structures taught in conjunction with solar-therma receiver tubes may be utilizaed in conjunction with concentrated photovoltaics (CPV-solar), "power towers", heliostats, trough-reflector solar systems, parabolic dish collectors, and other solar collection means.

Furthermore, the embodied hot-finger assembly is not intended to be limited to the mechanical coupling means of the first embodiments. For example, rather than a two-axis union, universal tilting may be obtained through use of co-axial alloy bellows, though such solution is viewed as less robust than the 2-axis rotating union similarly, rather than a dual-passage mechanical means for a tilt/pivot union, a single passage union could be made by preferred or alternative mechanical means, and a return (or supply) connection made at the top of the absorbing volume to exit through the CCC structure by optional flow passages. Such alternative embodiments are viewed as less preferred embodiments, and may be practiced without departing from the spirit and scope of the invention. Accordingly, it is not intended that the invention be limited to the structures and methods pointed out in the preferred embodiments.

What is claimed is:

1. A tracking and concentrating solar-thermal apparatus, comprising:
  a.) a solar concentrator comprising a sequence of inner frustum surfaces, the surfaces aligned sequentially along and concentric to a central axis, wherein a top plane intersects an upper edge of the frustum surfaces, the top plane normal to the central axis, wherein a base plane intersects a bottom edge of the frustum surfaces, the base plane normal to the central axis;
  b.) an absorber module disposed to receive solar radiation from the concentrator, the module comprising a glass tube transparent to the solar radiation, the glass tube defined by having a substantially tubular aspect, the tubular aspect centered on the central axis, the glass tube having an outer tube surface and an inner tube surface, the inner tube surface defining an absorber volume with an absorbing means disposed therein, the glass tube disposed between the top plane and the base plane, the module having a sealed top end, the module terminated opposite the top end by a module base structure comprising module interconnection means, such that the absorber volume is disposed between the module base structure and the sealed top end, the module interconnection means comprising a connector structure disposed to circulate a heat transferring fluid within the module, coaxial flow means disposed within the absorber volume, the coaxial flow means comprising an annular flow space defined by the inner tube surface, such that the heat transferring fluid flows within the annular flow space, wherein the heat transferring fluid is irradiated by the solar radiation when the module is receiving solar radiation from the concentrator, such that the absorbing means disposed within the absorber volume absorbs the radiation transmitted into the annular flow space; and, (c.) a mounting assembly, the mounting assembly comprising a pivot structure, the pivot structure having module interconnection means, the module interconnection means comprising a mounting surface demountable contacting the module base structure, such that the annular flow space is communicatively attached to a fluid volume defined by the pivot structure, the pivot structure comprising pivot means disposed such that the pivot structure rotates about a pivot axis, the pivot axis disposed on a side of the module base structure opposite the absorber volume, the pivot structure comprising pivot interconnection means, the pivot interconnection means disposed to interconnect the fluid volume to a work load, wherein the concentrator is attached to the pivot structure so as to rotate about the pivot axis during solar tracking.

2. The solar-thermal apparatus of claim 1, wherein the module includes a vacuum barrier structure.

3. The solar-thermal apparatus of claim 1, wherein the heat transferring fluid includes one of a group comprising oil and molten salt.

4. The solar-thermal apparatus of claim 1, wherein the heat transferring fluid provides heat in a hydrogen generating process.

5. The solar-thermal apparatus of claim 1, wherein the heat transferring fluid provides heat to a refrigeration system.

6. The solar-thermal apparatus of claim 1, wherein the absorbing means are incorporated in the heat transferring fluid.

7. The solar-thermal apparatus of claim 1, wherein the concentrator has an opening in its base, the opening having a diameter larger than that of the absorber volume.

8. The solar-thermal apparatus of claim 1, wherein the heat transferring fluid provides heat to refining processes.

9. The solar-thermal apparatus of claim 1, the absorbing means including by photovoltaic devices.

10. A tracking, concentrated solar-thermal apparatus, comprising:
 a.) a solar concentrator comprising a sequence of inner frustum surfaces, the surfaces aligned sequentially along and concentric to a central axis, wherein a top plane intersects an upper edge of the frustum surfaces, the top plane normal to the central axis, wherein a base plane intersects a bottom edge of the frustum surfaces, the base plane normal to the central axis;
 b.) an absorber module disposed to receive solar radiation from the concentrator, the absorber module comprising a tube structure, the tube structure defined by having a substantially tubular aspect, the tubular aspect centered on the central axis, the tube structure having an outer tube surface and an inner tube surface, the outer tube surface defining an absorber volume, absorption means within the absorber volume disposed to absorb the radiation, the tube structure disposed between the top plane and the base plane, the absorber module having a sealed top end, the module terminated opposite the top end by a module base, the module base intersected by a module plane, the module plane normal to the central axis, the module base comprising module interconnection means, such that the absorbing volume is disposed between the module base and the sealed top end, the interconnection means disposed to circulate a heat transferring fluid within the absorber module, such that the interconnection means are communicatively attached to an annular flow space defined by the inner tube surface, such that the heat transferring fluid flows within the annular flow space; and (c) a mounting assembly, the mounting assembly comprising a first sub-assembly and a second sub-assembly, the first sub-assembly having base interconnection means, the base interconnection means providing demountable connection to the module base, thereby providing fluid communication between the mounting assembly and the absorber module, the first sub-assembly comprising a pivot means interconnecting the first sub-assembly to the second sub-assembly such that the first sub-assembly rotates about a pivot axis fixed with respect to the second sub-assembly, the pivot means comprising a fluid union means communicatively connecting base interconnection means of the first assembly to fluid passageways of the second assembly, the second sub-assembly comprising fluid connection means allowing connection to a work load, the pivot axis disposed so as to reside on a side of the base interconnection means opposite the absorber module, the first sub-assembly comprising concentrator mounting means connecting the concentrator to the first sub-assembly, so that the concentrator pivots about the pivot axis during solar tracking.

11. The apparatus of claim 10, wherein the absorbing means are incorporated in the heat transferring fluid.

12. The apparatus of claim 10, wherein the heat transferring fluid provides heat to a refrigeration system.

13. The apparatus of claim 10, wherein the absorbing means include photovoltaic cells.

14. The apparatus of claim 10, wherein the tube comprises a spherical aspect.

15. The apparatus of claim 10, wherein the annular flow space contains a substantially annular array of fluid-guiding surfaces.

16. A tracking and concentrating solar-thermal apparatus, comprising:
 a.) a solar concentrator comprising a sequence of inner frustum surfaces, the surfaces aligned sequentially along and concentric to a central axis, wherein a top plane intersects an upper edge of the frustum surfaces, the top plane normal to the central axis, wherein a base plane intersects a bottom edge of the frustum surfaces, the base plane normal to the central axis;
 b.) an absorber module disposed to receive solar radiation from the concentrator, the absorber module comprising a tube structure, the tube structure defined by having a substantially tubular aspect, the tubular aspect centered on the central axis, the tube structure having an outer tube surface and an inner tube surface, the outer tube surface defining an absorber volume, absorption means within the absorber volume disposed to absorb the radiation, the tube structure disposed between the top plane and the base plane, the absorber module having a sealed top end, the module terminated opposite the top end by a module base, the module base intersected by a module plane, the module plane normal to the central axis, the module base comprising module interconnection means, such that the absorbing volume is disposed between the module base and the sealed top end, the interconnection means disposed to circulate a heat transferring fluid within the absorber module, such that the interconnection means are communicatively attached to an annular flow space defined by the inner tube surface, such that the heat transferring fluid flows within the annular flow space; and, (c.) a mounting assembly, the mounting assembly comprising a pivot structure, the pivot structure having module interconnection means, the module interconnection means comprising a mounting surface demountably contacting the module base, such that the module flow means is communicatively attached to a fluid volume defined by the pivot structure, the pivot structure comprising pivot means disposed such that the pivot structure rotates about a pivot axis, the pivot axis disposed on a side of the module plane opposite the absorber volume, a pivot interconnection means disposed to interconnect the fluid volume to a user application, wherein the concentrator is attached to the pivot structure so as to rotate about the pivot axis during solar tracking.

17. The apparatus of claim 16, wherein the heat transferring fluid provides heat to a heat engine.

18. The apparatus of claim 16, wherein the heat transferring fluid provides heat in a hydrogen generating process.

19. The apparatus of claim 16, wherein the tube comprises a spherical aspect.

20. The apparatus of claim 16, wherein the fluid volume is in an enclosure intersected by the pivot-axis.

* * * * *